United States Patent
Hammerschmidt et al.

(10) Patent No.: US 8,355,239 B2
(45) Date of Patent: Jan. 15, 2013

(54) PREDICTIVE PHASE LOCKED LOOP SYSTEM

(75) Inventors: Dirk Hammerschmidt, Villach (AT); Simon Hainz, Villach (AT); Tobias Werth, Villach (AT); Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 1023 days.

(21) Appl. No.: 12/361,654

(22) Filed: Jan. 29, 2009

(65) Prior Publication Data
US 2009/0190283 A1 Jul. 30, 2009

Related U.S. Application Data

(60) Provisional application No. 61/024,221, filed on Jan. 29, 2008.

(51) Int. Cl.
*H02P 5/50* (2006.01)
*H03L 7/08* (2006.01)
(52) U.S. Cl. ........... 361/243; 361/244; 375/215; 331/25
(58) Field of Classification Search .................. 361/240, 361/243, 244; 375/527, 215; 331/25
See application file for complete search history.

(56) References Cited

U.S. PATENT DOCUMENTS

| | | | |
|---|---|---|---|
| 4,494,509 A * | 1/1985 | Long | 123/406.19 |
| 5,982,239 A * | 11/1999 | Takahashi et al. | 331/11 |
| 7,208,944 B2 | 4/2007 | Tatschl et al. | |
| 7,308,060 B1 * | 12/2007 | Wall et al. | 375/355 |
| 7,469,491 B2 * | 12/2008 | McCallister et al. | 375/296 |
| 7,560,919 B2 | 7/2009 | Hatanaka et al. | |
| 2007/0146038 A1 | 6/2007 | Werner et al. | |

FOREIGN PATENT DOCUMENTS

| | | |
|---|---|---|
| DE | 10 2004 046 803 | 4/2006 |
| DE | 10 2006 000 492 | 9/2006 |

OTHER PUBLICATIONS

MC14046B Phase Locked Loop, Data Sheet, 1995, Motorola Inc., Rev 3, pp. 1-5.*

* cited by examiner

*Primary Examiner* — Rexford Barnie
*Assistant Examiner* — Zeev V Kitov
(74) *Attorney, Agent, or Firm* — Dicke, Billig & Czaja, PLLC

(57) ABSTRACT

A phase locked loop (PLL) circuit includes a first signal detector having a first input terminal configured to receive a varying first input signal, a second input terminal configured to receive a feedback signal that corresponds to the center of the input frequency, and an output terminal configured to provide an output signal corresponding to a phase difference between the first input and feedback signals. A delay estimator has an input terminal configured to receive the output signal from the first phase detector and in response thereto, output a phase difference estimation signal. A variable delay circuit has an input terminal configured to receive the phase difference estimation signal and in response thereto, phase shift the second input signal.

15 Claims, 20 Drawing Sheets

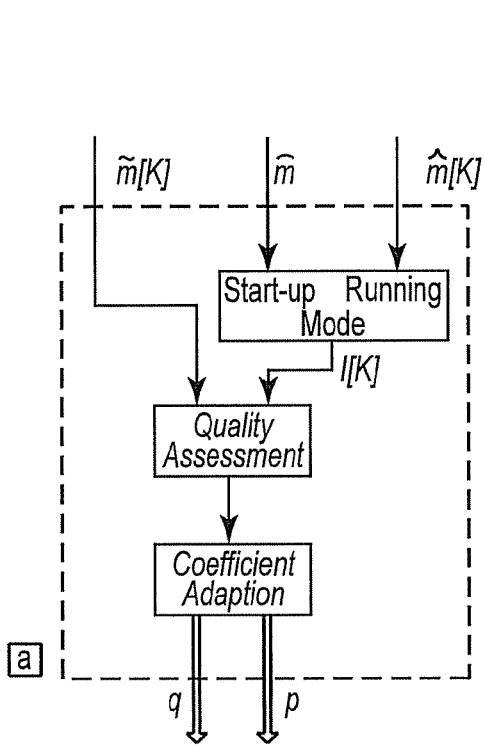
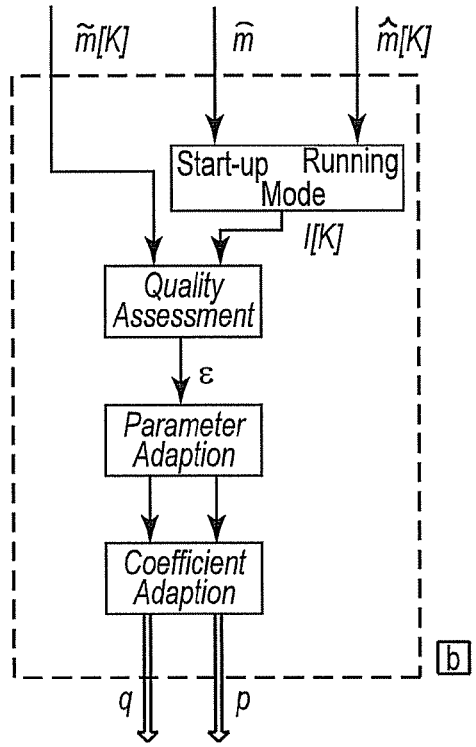
Fig. 11A                Fig. 11B
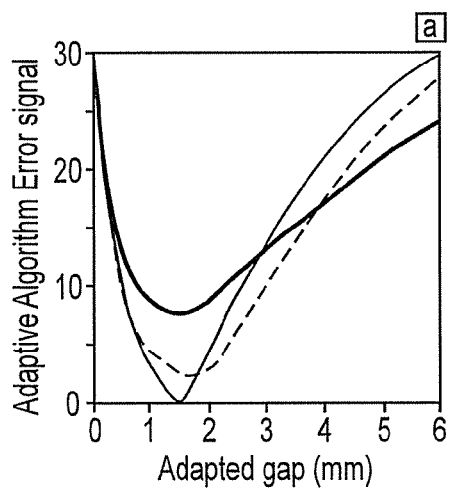
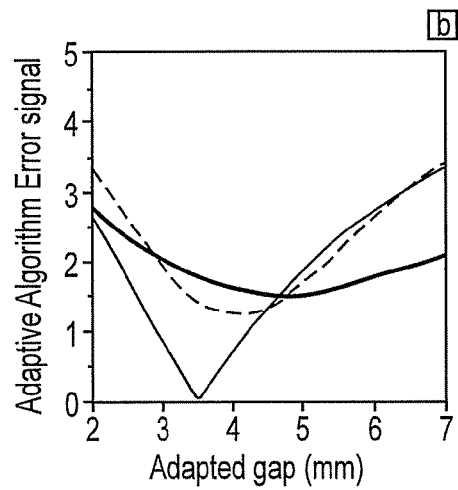
Fig. 12A                Fig. 12B

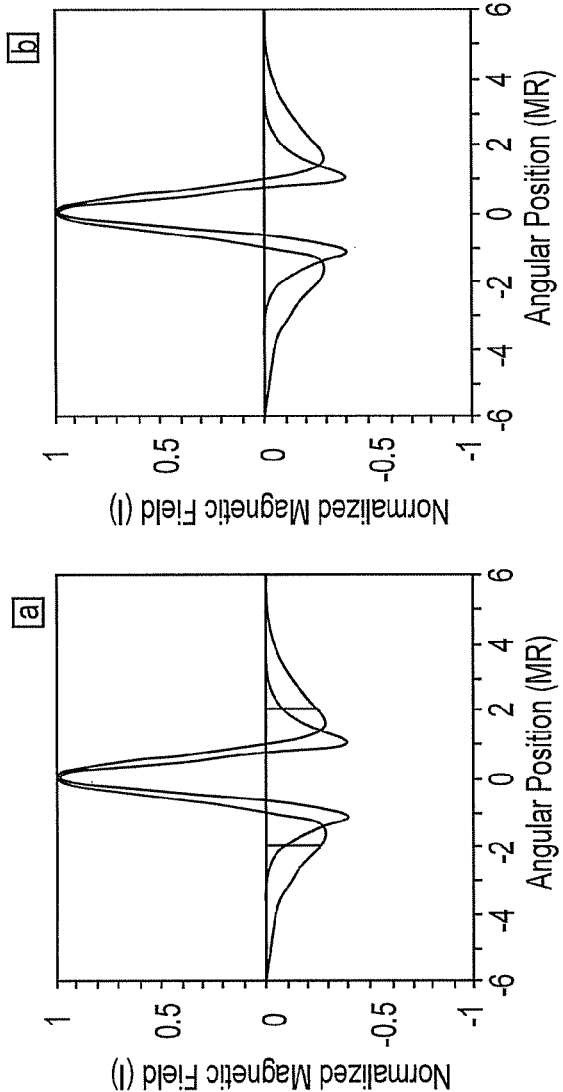
Fig. 13A Fig. 13B
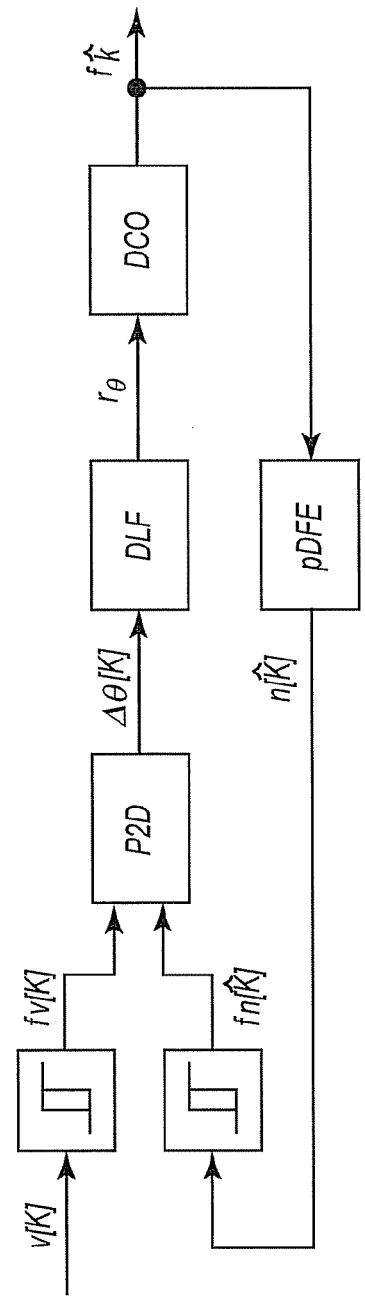
Fig. 14

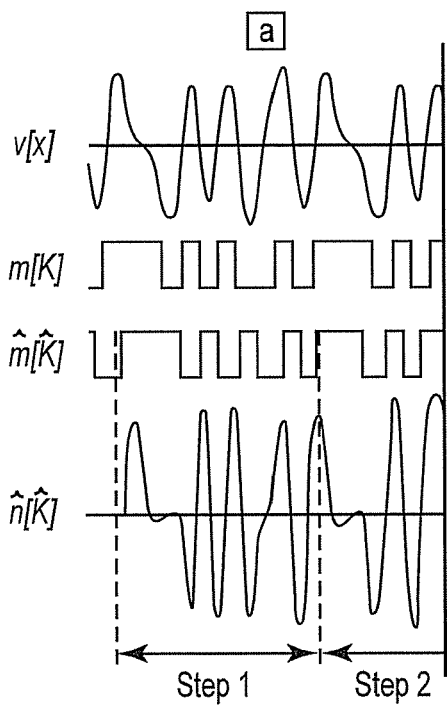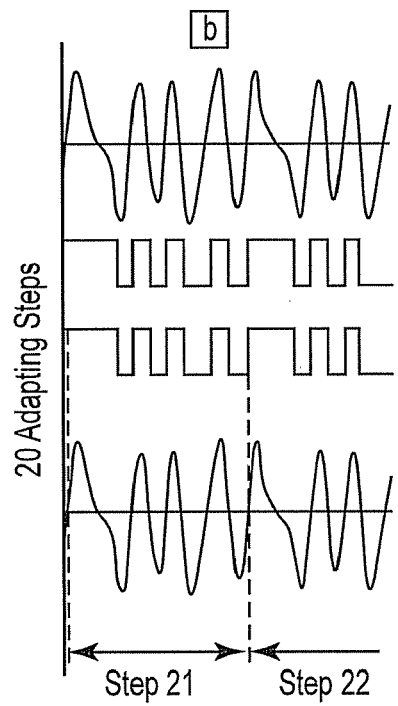
Fig. 18A   Fig. 18B
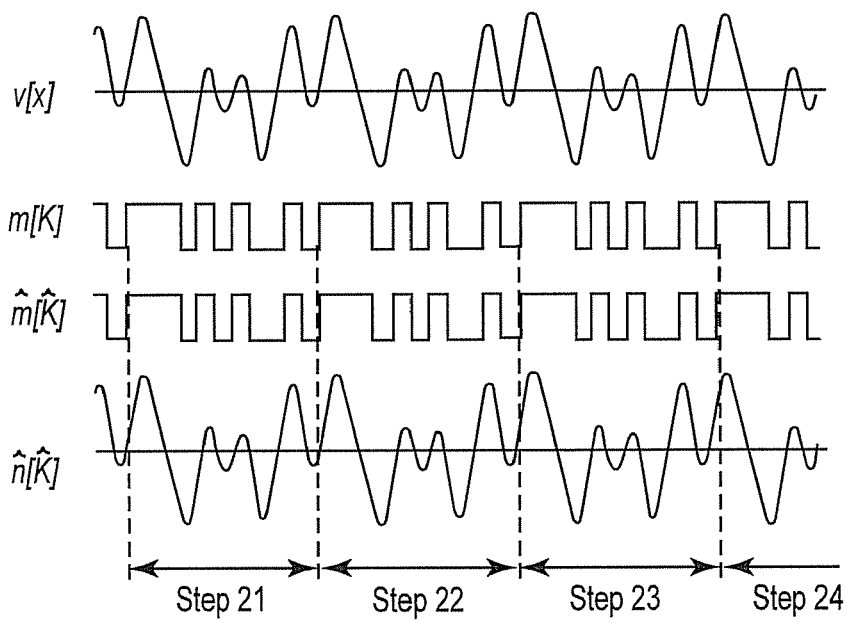
Fig. 19

PREDICTIVE PHASE LOCKED LOOP SYSTEM

CROSS-REFERENCE TO RELATED APPLICATIONS

This Non Provisional Patent Application claims benefit of U.S. Provisional Application 61/024,221, filed Jan. 29, 2008, entitled PREDICTIVE PHASE LOCKED LOOP SYSTEM, incorporated herein by reference.

BACKGROUND

Automotive sensors for angular measurement of camshafts and crankshafts are exposed to harsh environments (temperature variations between −40 and 150° C., mechanical vibrations, oil contamination, etc). Magnetic field sensors are often preferred to other sensor types due to their robustness and low production costs. In general, there are two widely used magnetic sensing arrangements that include a patterned wheel mounted on a rotating shaft and a magnetic field sensor.

In one arrangement, the patterned wheel is magnetically coded around its edge. The alternating magnetic regions pass the sensor and induce a magnetic field. If the pole wheel rotates, the normal component of the induced field at the position of the sensor has a sinusoidal-like shape. Pole wheels with different magnetic patterns are used for a variety of applications. Speed of a shaft, such as in an anti-lock brake system (ABS), can be obtained by using a regular patterned wheel, but for angular position measurements, such as for a camshaft, crankshaft, etc, an irregular pattern is required.

Another arrangement uses a toothed wheel which is coded by the length of the teeth and tooth spaces. A permanent magnet (back-bias magnet) placed behind the sensor creates a constant magnetic field which is influenced by the rotating wheel. If a tooth is in front of the magnet, the field at the sensors position is high and if a tooth space is in front of the magnet, the field is low. The rotating toothed wheel shapes the magnetic field at the position of the sensor element resulting in a field which has similar shape as described on pole wheels. However, an additional DC component—which is caused by the unipolar nature of the magnetic field—appears and therefore the signal has no zero value. Regular patterned wheels are used to transmit mechanical forces.

In sensing arrangements such as these, the magnetic field sensor element (e.g. Hall, Giant Magneto Resistance, GMR, etc.) converts the applied magnetic field into a linear proportional electrical signal. Signal processing is used to convert the sinusoidal-like shaped signal into a binary sequence which is a rough representation of the pattern on the wheel. Knowing the pattern, the rotational speed and angular position can be determined from this binary signal.

Packaging and mounting tolerances, mechanical vibrations and temperature variations cause variations of the air gap between the patterned wheel (pole wheel or toothed wheel) and the sensor element. Therefore, the magnetic field at the sensor's position also can vary, resulting in variations of the electrical signal shape and a displacement of the peak and zero value positions in the signal. Known signal processing concepts do not take into account the gap dependent waveform variations and displacement of peak and zero value positions, which can result in angle measurement errors.

For instance, signal processing is used to convert the analog output voltage of the sensor element into angular position information. Processing power on single chip integrated sensors is limited and therefore simple circuits or algorithms are used for conversion.

Many sensor concepts remove the DC component of the analog output voltage of the differential sensor voltage v(x). This makes the subsequent signal processing applicable on both sensing arrangements using pole wheels or toothed wheels. Therefore, removing of the DC component is also common on pole wheel measurements.

A frequently used (analog) solution to remove the DC component is to estimate and remove the average value of the analog signal. Other (digital) solutions calculate the mean value of the last maxima and minima, which leads to comparable results. Yet another solution is to adjust the DC component until a 50% duty cycle of the binary output signal is reached.

Differential measurement is also a well known strategy to remove the DC component. Two sensor elements measure the magnetic field at different positions around the edge of the wheel. The DC component of the analog output voltage of both sensor elements is similar and the AC component is shifted by their separation distance. Subtracting these two signals minimizes the DC component and doubles the AC amplitude if the separation distance equals 1 MR. Due to the imbalances between the two sensor elements, parasitic offset voltages, etc., only about 90 to 95% of the DC component can be removed using differential measurement with Hall elements. Therefore the above described strategies are additionally used to remove the (small) remaining DC component. After removing the DC component, the waveform obtained from measurements using toothed wheels or pole wheels are similar.

Zero crossing detection is used to convert the analog sensor signal in a binary signal, which is an electric image of the pattern on the wheel (toothed wheel or pole wheel). Knowing this pattern, angle (and speed) information can be determined by evaluating the binary signal. Sensor solutions (using Hall elements) are able to detect zero crossings with high accuracy and the 1σ-jitter is below 0.001 MR. However, due to gap variations displacement of the zero value (up to 0.28 MR) can appear.

Displacements resulting from gap variations typically cannot be avoided even if different sensing arrangements are used. Thus, that DC cancellation is an insufficient strategy to obtain highest angular accuracy and that the displacement must be taken into account. A shown in U.S. Pat. No. 7,208,944 (incorporated by reference herein), digital signal processing can be used to compensate the displacements caused by air gap variations. With this signal processing also other effects (variations of the magnetization strength of the pole wheel etc.) can be compensated.

To allow digital signal processing, a clock signal is required. To reduce complexity of signal processing the frequency of the clock signal must be synchronous to the revolution speed of the engine. The revolution speed of an engine varies typically between 0 and 14000 rpm and a Phase Locked Loop (PLL) can be used to follow this speed variation and generate a clock signal for the digital signal processing unit. However, due to the impulsive forces acting onto the pistons during explosion and compression stroke the revolution speed of the crankshaft varies slightly as shown in FIG. 21. A conventional PLL cannot follow these frequency variations and phase differences between the revolution speed (pattern frequency on the pole wheel) and the PLL frequency appear.

For these and other reasons, there is a need for the present invention.

SUMMARY

A phase locked loop (PLL) circuit includes a first signal detector, such as a phase or frequency detector, having a first input terminal configured to receive a varying first input signal, a second input terminal configured to receive a feedback signal that corresponds to the center of the input frequency, and an output terminal configured to provide an output signal corresponding to a phase difference between the first input and feedback signals. A delay estimator has an input terminal configured to receive the output signal from the first phase detector and in response thereto, output a phase difference estimation signal. A variable delay circuit has an input terminal configured to receive the phase difference estimation signal and in response thereto, phase shift the second input signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 11 is a block diagram illustrating an embodiment of an adaptation strategy using start-up and running modes.

FIGS. 12A and 12B illustrate the performance function for an embodiment of a sensing arrangement using two sensing elements.

FIGS. 13A and 13B illustrate calculated tangential pulse shapes for different filter lengths.

FIG. 14 is a block diagram illustrating an embodiment of an All-Digital PLL (ADPLL).

FIGS. 18A and 18B illustrate signals for modeled embodiments of a pDFE.

FIG. 19 illustrates simulation results for an embodiment of a pDFE.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Among other things, a "predictive PLL" that can follow fast frequency variations and generate a clock signal for a digital signal processing unit is disclosed herein. An exemplary application of the predictive PLL is described below; however, the predictive PLL is applicable in other applications.

Figure 1A:
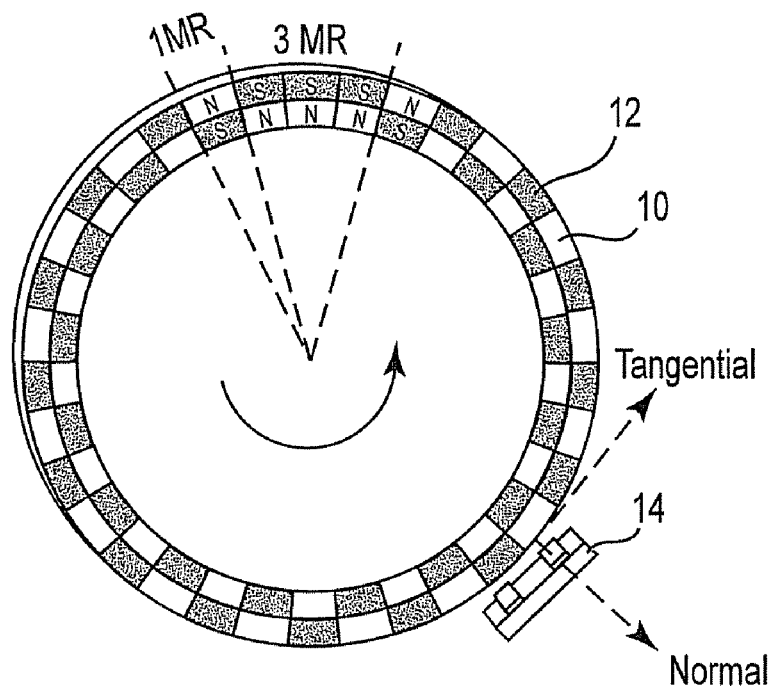
FIG. 1A schematically illustrates an embodiment of a rotatable patterned wheel system.

FIG. 1A illustrates a rotatable patterned wheel 10 that includes a magnetic coding 12 around its edge. In general, the alternating magnetic regions of the coding 12 pass a sensor 14 and induce a magnetic field. If the pole wheel 10 rotates, the normal component of the induced field at the position of the sensor 14 has a sinusoidal-like shape. Pole wheels with different magnetic patterns are used for a variety of applications. Speed of a shaft, such as in an anti-lock brake system (ABS), can be obtained by using a regular patterned wheel, but for angular position measurements, such as for a camshaft, crankshaft, etc, an irregular pattern is required. The wheel 10 illustrated in FIG. 1A has an irregular pattern. Other wheel arrangements with more irregular patterns are also used because they allow synchronization on multiple positions of the wheel.

Figure 1B:
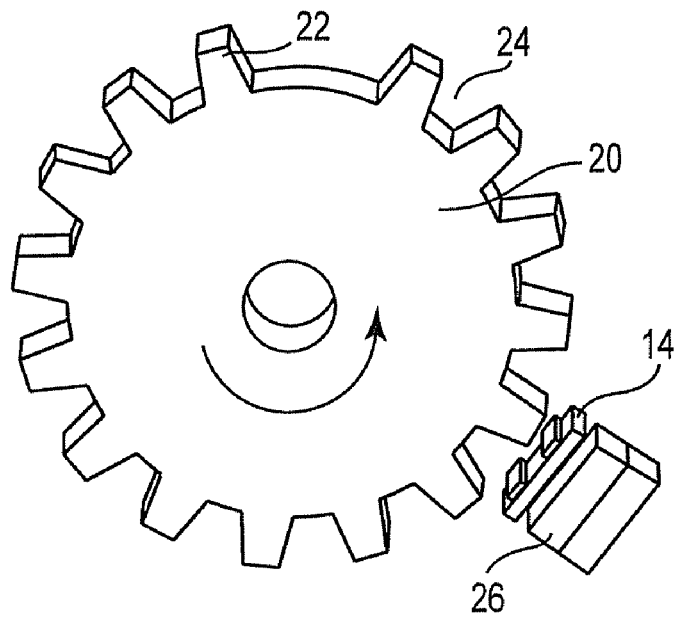
FIG. 1B schematically illustrates an embodiment of a rotatable toothed wheel system.

FIG. 1B illustrates a toothed wheel 20 that is coded by the length of the teeth 22 and tooth spaces 24. A permanent magnet 26 (back-bias magnet) placed behind the sensor 14 creates a constant magnetic field that is influenced by the rotating wheel 20. If a tooth 22 is in front of the magnet 26, the field at the sensors position is high and if a tooth space 24 is in front of the magnet 26, the field is low. The rotating toothed wheel 20 shapes the magnetic field at the position of the sensor element 14 resulting in a field which has similar shape as described on pole wheels. However, an additional DC component—which is caused by the unipolar nature of the magnetic field—appears and therefore the signal has no zero value.

The magnetic field sensor element 14 (e.g. Hall, Giant Magneto Resistance, GMR, etc.) converts the applied magnetic field into a linear proportional electrical signal. Signal processing is used to convert the sinusoidal-like shaped signal into a binary sequence which is a rough representation of the pattern on the wheel. Knowing the pattern, the rotational speed and angular position can be determined from this binary signal.

Due to the similarities between sensing arrangements using a patterned wheel and sensing arrangements using a toothed wheel, signal processing schemes disclosed herein are applicable to either to improve the angular accuracy. For simplicity, the focus of this disclosure is on the arrangement using a pole wheel.

From a digital communication theory point of view, a transmission channel $f_M(x,P)$ transforms the magnetic coding m[k] around the edge of the pole wheel to a magnetic field at the sensor's position. This field depends primarily on the angle of the wheel and secondarily on physical parameters P such as the gap between sensor element and the pole wheel. In this disclosure, the angle of the wheel is expressed as a geometric length x measured around the edge of the wheel. The measuring unit is the length of one magnetic region (MR), which is typically 2.5 mm (1 MR=2.5 mm).

Figure 2A:
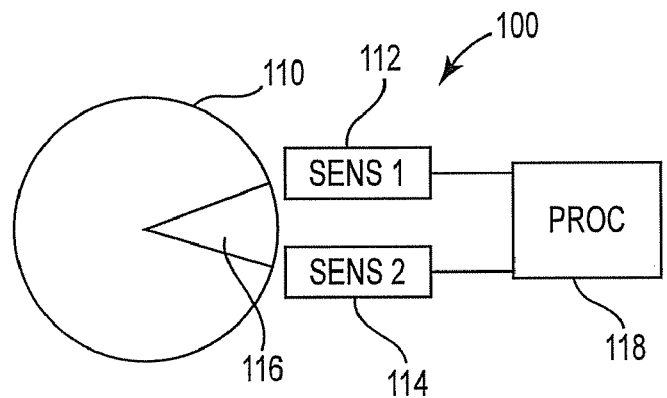
FIG. 2A conceptually illustrates an embodiment of a system including a differential sensing arrangement.

FIG. 2A conceptually illustrates an embodiment of a system 100 including a differential sensing arrangement. The system 100 includes a rotatable wheel 110 such as the wheel 10 or 20 illustrated in FIGS. 1A and 1B. As noted above, the wheel 110 creates a varying magnetic field as it rotates. Two sensors 112, 114 are spaced apart by a separation distance 116 and are configured to generate respective signals in response to the varying magnetic field. The signals from the sensors 112, 114 are received by a processor 118.

Figure 2B:
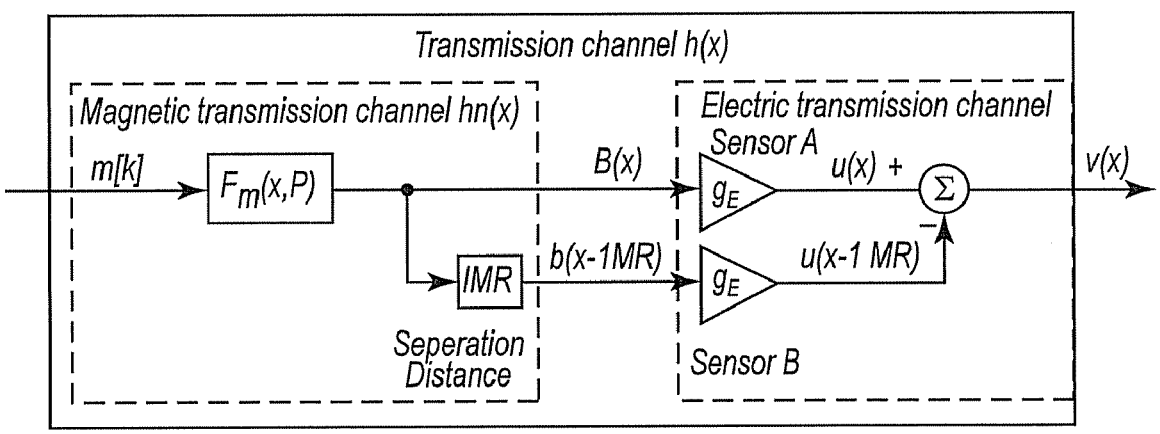
FIG. 2B is a block diagram further illustrating the differential sensing arrangement of FIG. 2A.

The system 100 uses a differential sensing arrangement that is further illustrated in FIG. 2B. The sensing arrangement is implemented by the processor 118, which could be any suitable computing or data processing environment, including in digital electronic circuitry (for example, an application-specific integrated circuit (ASIC) or a digital signal processor (DSP)) or in computer hardware, firmware, device driver, or software. The sensing arrangement includes [k]: magnetic coding around the edge of the pole wheel 110; b(x) and b(x−1MR): magnetic field at the position of the sensor elements A (112) and B (114), respectively; u(x) and u(x−1MR): sensor elements output voltage; v(x): differential output voltage.

As noted above, two sensor elements 112,114 are spaced apart by the separation distance 116, for example, the length of one magnetic region (MR), and the magnetic field is measured at the positions x and x−1MR, respectively. Each sensor element 112,114 generates an electrical voltage which is in first considerations directly proportional to its applied magnetic field. Subtracting the output voltage u(x−1MR) of sensor element 114 from the voltage u(x) of element 112 leads to the differential output voltage v(x)=u(x)−u(x−1MR).

Figure 3B:
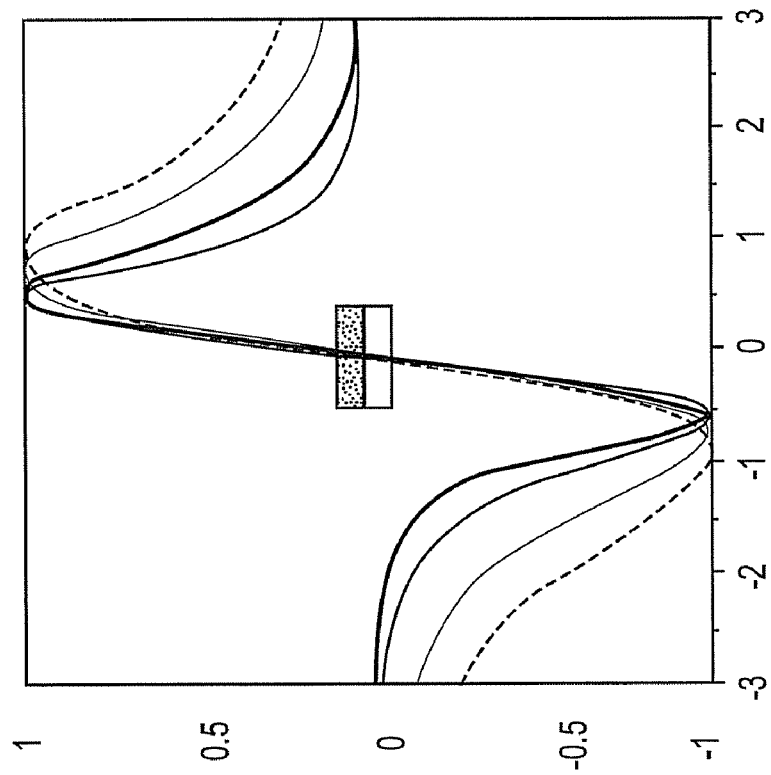
FIG. 3B illustrates a normalized tangential component of a magnetic field generated by a single magnetic region of the sensing arrangement of FIG. 2 using a patterned wheel such as that illustrated in FIG. 1A.
Figure 3A:
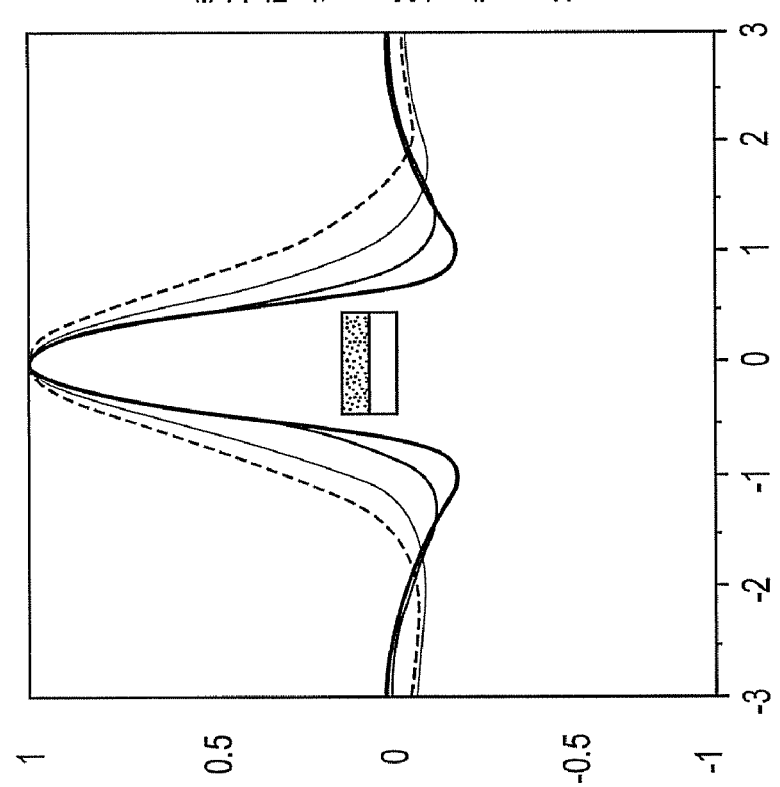
FIG. 3A illustrates a normalized normal component of a magnetic field generated by a single magnetic region of the sensing arrangement of FIG. 2 using a patterned wheel such as that illustrated in FIG. 1A.

Transmitting a single magnetic region through the magnetic channel $f_M(x)$ causes a magnetic field at the position of the sensor element with a pulse shaped normal component as shown in FIG. 3A. Physical parameters such as gap (between sensor and magnetic wheel), temperature and magnetic dipole moment (of the magnetic region) change the channel characteristic resulting in different pulse shapes of the field. Increasing the gap causes a lowering of the magnetic field intensity (pulse peak) and an increasing pulse width. (The lowering of the field cannot be seen in FIG. 3 due to normalization).

Figure 4:
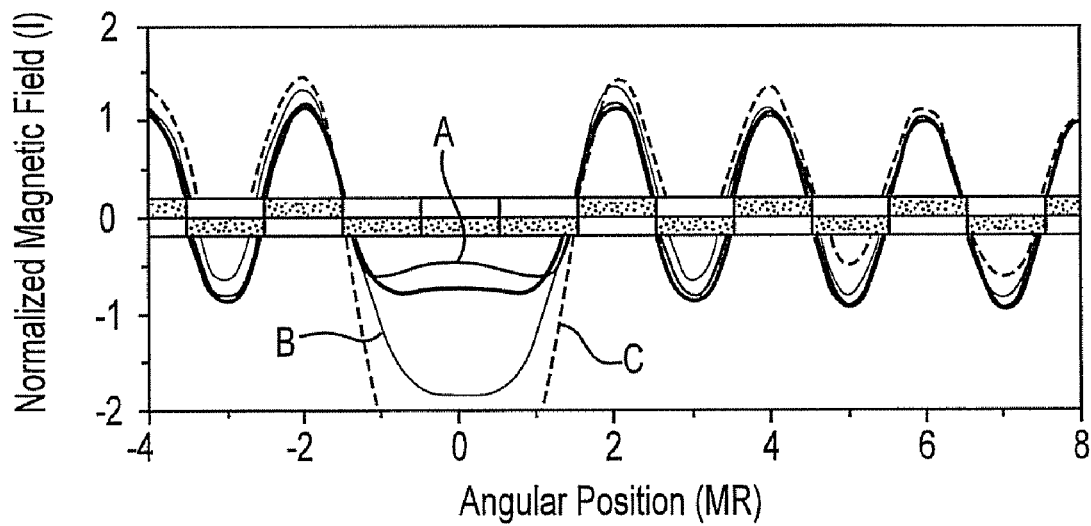
FIG. 4 illustrates a normalized normal component of a magnetic field generated by the sensing arrangement of FIG. 2.
Figure 5:
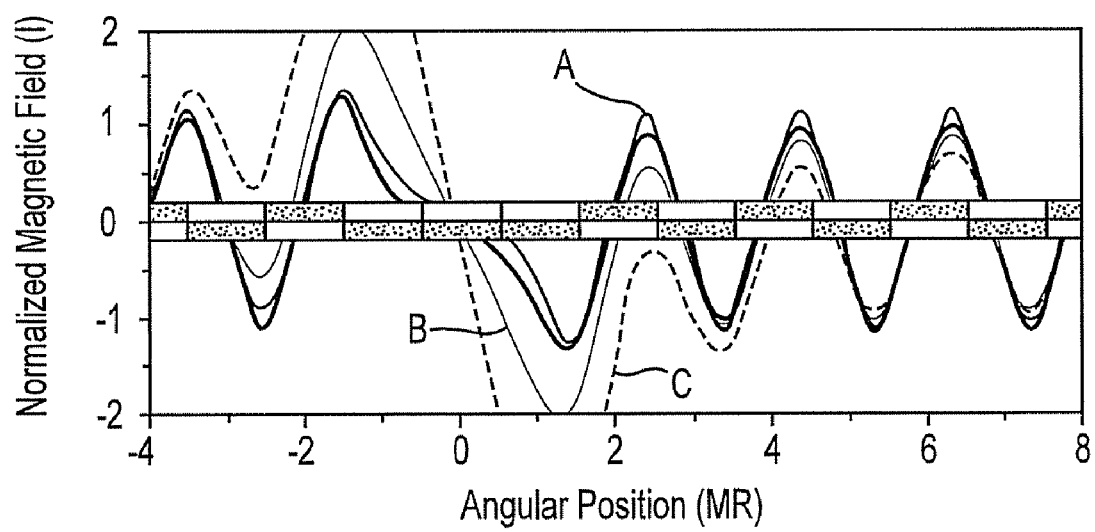
FIG. 5 illustrates a normalized tangential component of a magnetic field generated by the sensing arrangement of FIG. 2.

In contrast to the pulse shape of the normal component, the shape of the tangential component is a double-pulse as shown in FIG. 3B. Again, increasing the gap causes a decreasing magnetic field and an increasing width. Transmitting more than one magnetic region and assuming that each one generates such a field and they do not influence each other, the resulting field b(x) can be calculated using linear superposition. Calculation results—using linear superposition—are shown normalized in FIG. 4 and FIG. 5 for the normal and tangential components of the magnetic field, respectively. In FIG. 4, the normalized normal component of the magnetic field distribution on a rotating pole wheel are illustrated. Variations of the gap: 1 mm (A), 1.5 mm, 2.5 mm (B); 3.5 mm (C). In FIG. 5, the normalized tangential component of the magnetic field distribution on a rotating pole wheel is illustrated. Variations of the gap: 1 mm (A), 1.5 mm (B), 2.5 mm; 3.5 mm (C).

Increasing the gap between sensor and pole wheel causes a variation of the signal shape resulting in a displacement of the position of zero values as well as of the positions of maxima and minima. Increasing the gap from 1 mm to 3.5 mm shifts the zero value of the normal component by up to 0.28 MR. On the tangential component a displacement can also be observed and for a gap of 3.5 mm one zero value is even missing.

The magnetic field generated by a single magnetic region extends to its neighboring regions, which causes interference. Because the pulse width varies as a function of the gap, the interference with the neighboring regions also varies, resulting in a displacement of the peak and zero value positions in the waveforms of the magnetic field.

Figure 7:
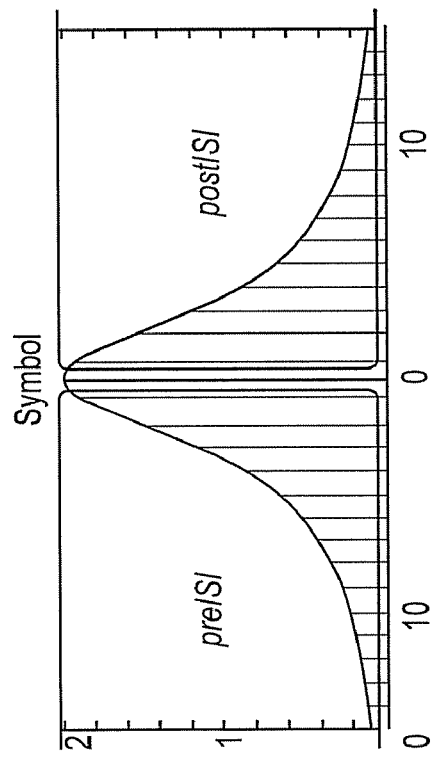
FIG. 7 conceptually illustrates Intersysmbol Interference (ISI).

Similar effects are known in other applications like the replay process of a Hard Disk Drive (HDD) where a magnetic field sensor measures the magnetic field above a magnetized rotating platter. High data densities move the magnetic regions closer to each other and Intersymbol Interference (ISI) appears. FIG. 7 illustrates ISI. Also in digital data transmission, the data get influenced by the distortion of the transmission channel and ISI appears.

Figure 8:
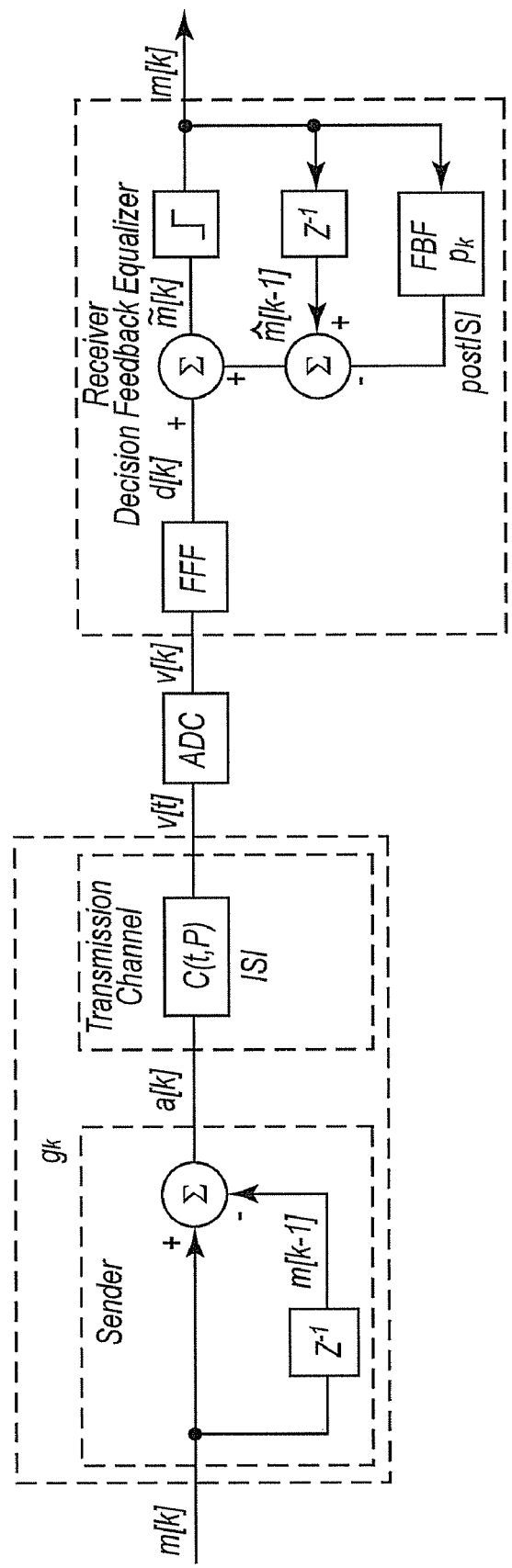
FIG. 8 is a block diagram illustrating an embodiment of a Decision Feedback Equalizer (DFE).

A Decision Feedback Equalizer (DFE) is a filter used to remove ISI. FIG. 8 illustrates an example embodiment of a DFE. In digital data transmission, partial-response techniques are used to shift the frequency spectrum of the data sequence to a frequency range which is better matched to the transmission channel. Subtracting or adding the last and actual data bit shifts the frequency spectrum to higher or lower frequencies, respectively.

Figure 6:
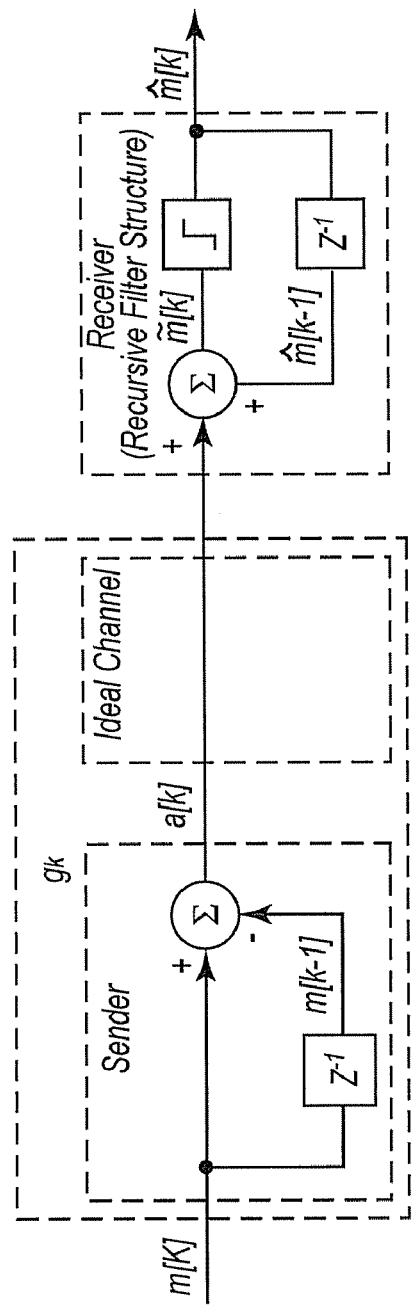
FIG. 6 is a block diagram illustrating an embodiment of a partial-response equalizer.

FIG. 6 illustrates an embodiment of a partial-response equalizer. The sender in FIG. 6 transforms the digital input data $m[k] \in \{-1,1\}$ in $a[k]=m[k]-m[k-1]$ where $a[k] \in \{-2,0,2\}$. Assuming an ideal transmission channel where no ISI appears, the transmitted data can be reconstructed using the recursive filter $\hat{m}[k]=a[k]+\hat{m}[k-1]$. Knowing the last datum $\hat{m}[k-1]$, the actual datum $\hat{m}[k]$ can be calculated.

However, for k=0 the last datum cannot be known and an assumption has to be made. If this assumption was wrong the following reconstruction yields $\hat{m}[k] \in \{1,3\}$ or $\hat{m}[k] \in \{-1,-3\}$. Therefore a slicer (discriminator) is used to force $\hat{m}[k] \in \{-1,1\}$.

In a real transmission channel, distortion appears resulting in interference of the data (symbol) at the actual position to the data at the last and next positions. This can be mathematically described as a convolution of the differential data a[k] with a function c(t) which represents the distortion, $v(t)=a[k]*c(t)$.

The transmitted data can be estimated from v(t) only if the effects of ISI have been removed. Under the assumption that ISI was removed, the same recursive filter structure as shown in FIG. 6 can be used for reconstruction.

The DFE, shown FIG. 8, is widely used in different applications to remove ISI effects. Assuming that ISI was removed from v[k−1] and the reconstruction was successful, the last data m[k−1] is known at the receiver. The interference of this last data to the actual position (called post-ISI) can be calculated if the transfer characteristic of the channel is known.

The DFE, shown in FIG. 8, employs the feedback-filter (FBF) to generate post-ISI which is subtracted prior to discrimination.

Because future data is unknown, the same approach cannot be used to calculate pre-ISI. Therefore ISI of future symbols gets predicted and removed by the feed forward filter (FFF) of the DFE.

The FBF and FFF can be implemented either as infinite impulse response (IIR) or as finite impulse response (FIR) filters whereby FIR filter are more commonly used due to their guaranteed stability.

Usually the distortion of the channel is unknown. Therefore, adaptive algorithms (AA) are used to estimate the coefficients of the DFE. A training sequence l[k]—which is known at the receiver—gets transmitted through the unknown transmission channel. At the receiver the AA compares the signal $\hat{m}[K]$ (the signal after partly removing ISI) with the known training sequence l[K] and generates an error signal ε which identifies remaining ISI in $\hat{m}[K]$. The optimal filter coefficients to remove ISI of the channel can be estimated by minimizing the error signal. After completed estimation $\hat{m}[K]$ matches l[K] and all ISI of the channel gets removed.

During the following data transmission, the estimation can be continued which allows removing ISI also if the transfer characteristic of the channel varies.

As shown in FIG. 2, the two sensor elements are placed on a separation distance of 1 MR. At constant revolution speed this distance in space can also be expressed as a delay Δt in time. The magnetic transmission channel in the space domain (FIG. 2) can be transposed into the time domain which leads to an output voltage $v(t)=u(t)-u(t-\Delta t)$. The similarities between the magnetic transmission channel (h(x) in FIG. 2) and the transmission channel in the digital data transmission ($g_k$ in FIG. 8) make clear that the DFE can also be used to remove ISI resulting from the magnetic transmission channel. However, this is only possible if the sampling period of DFE is equal to the delay in time between the two sensor signals.

Removing ISI effects using a DFE allows determining the magnetic states of a pole wheel. In contrast to digital communication, in sensor applications the relevant information is the transition between magnetic states (position) and not the states (data) itself. Therefore a pattern on the wheel with high symbol density is assumed. Determining the high density pattern allows identifying the transition between magnetic states more accurately.

At higher symbol density, the DFE has to work at a higher sampling rate resulting in higher order FIR filters. To remove the same amount of ISI at higher sampling rate $f_K=\psi \cdot f_k$, the filter order has to be increased by factor ψ.

The input signals for the FBF and FFF are the binary sequence $\hat{m}[K]$ (equals $\hat{m}[k]$ with higher sampling rate $f_K$) and the multi-bit signal v[K], respectively. Increasing the filter order for both filters causes a moderate increase in filter complexity for the single-bit FBF and a drastic increase for the multi-bit FFF. To reduce complexity of the DFE, a structure without of the need of a FFF is required.

Figure 9:
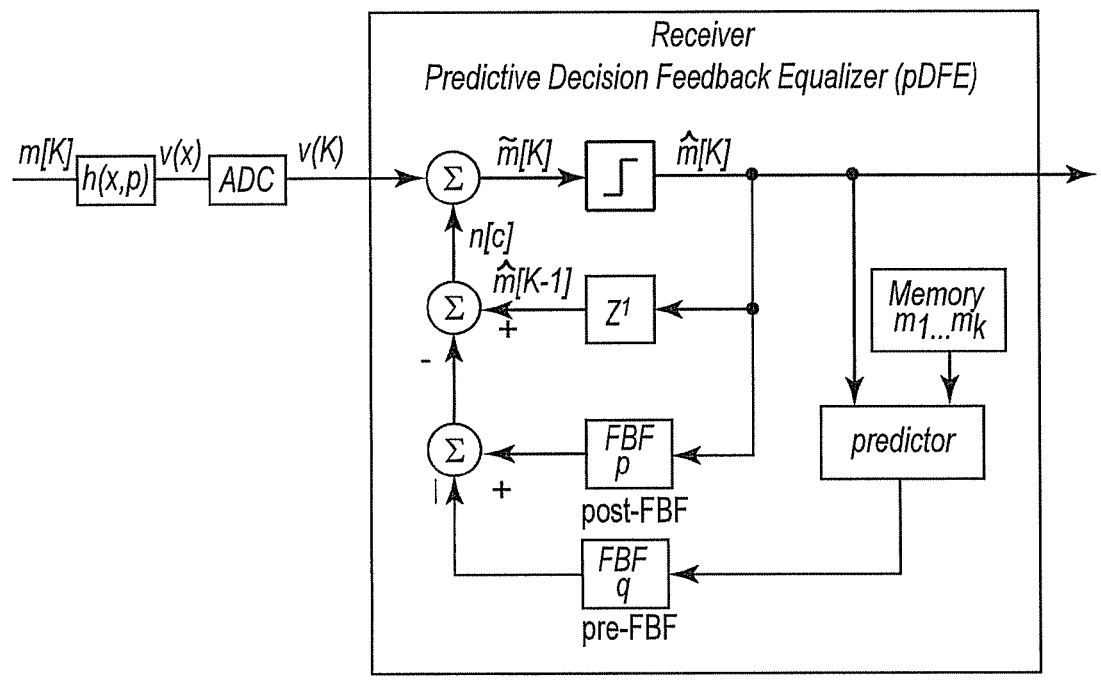
FIG. 9 is a block diagram illustrating an embodiment of a Predictive Decision Feedback Equalizer (pDFE).

A modified filter structure referred to as Predictive DFE (pDFE), illustrated in FIG. 9, employs a standard FBF (now called post-FBF) to generate post-ISI. The FFF is replaced by an additional filter in the feedback path, called pre-FBF. The inputs for this filter are the predicted states of next magnetic regions on the wheel which allows generating pre-ISI. This prediction is possible because the rotating wheel generates a periodic sequence. Once the position is tracked, states of next regions can be read from memory. Then pre- and post-ISI get subtracted prior to discrimination.

Figure 10:
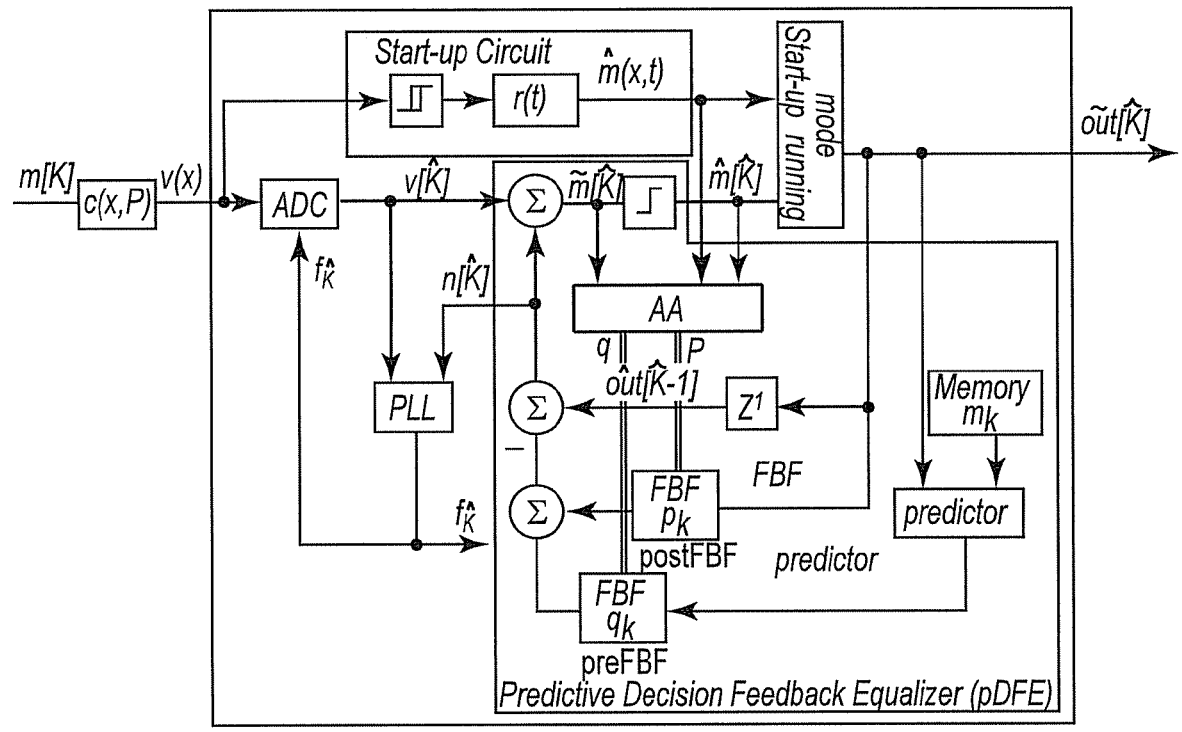
FIG. 10 is a block diagram illustrating an embodiment of a pDFE with a phase locked loop (PLL) and adaptive algorithm.

The unknown transfer characteristic of the magnetic transmission channel can be estimated using an adaptive algorithm. FIG. 10 illustrates an embodiment of a pDFE with a phase locked loop (PLL) and adaptive algorithm. In contrast to digital communication, in angular measurement the use of a training sequence is not possible because the starting time of the training sequence (the angle of the wheel) is not known. Therefore a new strategy for the adaptation, using start-up and running mode, is proposed in FIG. 11A.

During start-up mode, zero crossing detection of signal v(x) is used to generate the binary signal $\hat{m}(x,t)$, which is a rough estimation of the pattern on the wheel. Using $\hat{m}(x, t)$ as a low quality training sequence allows the AA to coarsely estimate the filter coefficients and ISI get partly removed.

Then the pDFE switches in running mode and uses the signal with partly removed ISI as new training sequence. Starting from the previous coarsely estimated coefficients, their value can now be estimated more precisely. ISI of the channel gets removed and the phase accuracy of the system gets improved successively.

In digital communications, ISI gets typically removed over a few symbols resulting in low order (2 to 3) FIR filters for the DFE. Common AAs estimate each filter coefficient of the FIR filters separately which is easy to implement also on chip.

In sensor applications, high angular accuracy requires high data rates resulting in high order (e.g. 100) FIR filters. Adapting all filter coefficients separately requires large processing power or hardware which is difficult to implement on single chip integrated sensors. Therefore an enhanced AA, using a physical model, is proposed.

The transmission channel between wheel and sensor can be described by the transfer function h(x,P) (see FIG. 2) which depends on the physical parameters P (temperature, gap, magnetic dipole moment, etc.). If the relationship between physical parameter and transfer function h(x,P) and the values of the physical parameter are known, the transfer characteristic of the channel is defined.

Using this approach the AA in FIG. 11A can be expanded as shown in FIG. 11B and the values of the physical parameter get estimated instead of estimating the filter coefficients directly. With the adapted physical values the channel distortion—and so also the filter coefficients to remove this distortion—can be calculated using the physical model.

In general, the transmission channel depends on many physical parameters. Due to limited calculation power of the sensor chip a simple channel model must be found. The presented AA calculates the magnetic field as a function of gap and magnetic dipole moment (temperature variations primarily affect the magnetic moment). The calculated magnetic field of a pole wheel using the simple model was verified with FE simulations and it is shown in that the deviation between them is below 2% on gaps between 1 mm and 7 mm.

However, a physical model with more or less parameters can be used to calculate the magnetic field. Further, a Look-Up Table, storing the results of FEM simulations, is a possible solution.

A benefit of the new structure is that the AA has to estimate two physical parameters values instead of hundreds of uncorrelated filter coefficients. Compared to a conventional AA structure, the presented structure needs further processing or hardware to calculate the filter coefficients from the physical values. The presented structure is very suitable if high order FIR filers are used or if a simple model of the channel can be found.

The "performance function" shows the value of the error signal as a function of all parameters of the adaptive algorithm. Using the physical parameter values at the global minimum of the performance function (minimal error signal), the calculated waveform using the simple model is matching the measured waveform. The adaptive algorithm should find the global minimum of the performance function by varying the parameter values and evaluating the error signal. From the nature of the problem, local minima can appear in the performance function which complicates the localization of global minimum.

The performance function of an algorithm with two physical parameters has three dimensions (gap, magnetic dipole moment and error signal) and the search for local minima can be performed easily. Using a few hundred uncorrelated filter coefficients causes a few hundred dimensional performance function and the search for local minima will develop to a nearly impossibly solvable problem. This is a further advantage of estimating the physical parameters instead of adapting the filter coefficients directly.

The solid line in FIGS. 12A and B show the performance function for a sensing arrangement using two GMR elements on a gap of 1.5 mm and 3.5 mm, respectively. It can be seen that the value of the error signal has its global minimum if the estimated value for the gap is equal to the physical value.

So far it was assumed that the pDFE is able to calculate the magnetic field distribution without errors if the physical parameters are known. Due to finite filter order of the pre- and post-FBF, also the length of the calculated pulse shape is finite. The geometric length (expressed in MR) is equal to the used filter order divided by the used number of samples per magnetic region.

FIG. 13 illustrates the calculated tangential pulse shape depending on the filter length variations of the gap (solid: 1.5 mm; dash: 3.5 mm). In FIG. 13A the filter length is ±2 MR; in FIG. 13B the filter length is ±4 MR.

The limited length of the calculated pulse shape causes deviations between measurements and calculations (as shown in FIG. 13) resulting in a wrong error signal. Therefore the use of very high order FIR filters or IIR filters is proposed.

A wrong error signal is also caused by the accuracy of the used physical model. Highest accuracy can be achieved if a complex model with many parameters is used. Noise in $\hat{m}[k]$, $\hat{m}$ and $\hat{m}[k]$ also affects the error signal and consequently the performance function of the adaptive algorithm.

So far a constant revolution speed resulting in a constant clock frequency for the pDFE was assumed. In the general case, the revolution speed of the automotive combustion engine varies over a range from 0 to 8,000 RPM. This causes frequency variations of the magnetization pattern on the wheel between 0 and 8,000 Hz on a wheel with 120 magnetic regions.

Using a constant clock frequency for the pDFE, the number of samples per magnetic region varies between different revolution speeds and the filter coefficients have to change as a function of speed which is difficult to implement. Therefore a variable clock frequency for the pDFE—having a constant number of samples per magnetic pole $\psi$—is proposed. With this variable clock frequency the filter coefficients do not need to be updated for speed variations.

The clock frequency of the pDFE (now called $f_{\tilde{K}}$) has to follow the revolution speed of the engine which can be realized using a PLL. Analog PLLs can follow speed variations only in a small frequency range (a few percent). Therefore an All-Digital PLL (ADPLL), where the frequency range is only limited by the bit-length of the counter in the Digital Controlled Oscillator (DCO), is used.

The general ADPLL consists of a Phase to Digital converter (P2D), a Digital Loop Filter (DLF), a Digital Controlled Oscillator (DCO) and a frequency divider. FIG. 14 shows an example of an ADPLL where the frequency divider, with a division factor of $\psi$, is realized by the pDFE. The additional Schmitt trigger circuits transform the multi-bit signals v[K] and n[$\hat{K}$] into the binary signals with frequencies $f_{v[K]}$ and $f_{n[\hat{K}]}$, respectively. The phase and frequency differences between input signals of the P2D are converted into a digital output signal $\Delta\Theta$. This signal consists of both DC and AC components. In the locked state of the PLL the DC component is roughly proportional to the phase difference between the two frequencies whereas the AC component is unwanted noise. Via a digital low pass filter (DLF), the AC noise is suppressed. In the steady state the frequency of the output signal of DCO is $\psi f_{v[K]}$. This signal is used as clock signal for the pDFE.

In combustion engines the revolution speed of shafts varies slightly due to the impulsive forces acting during explosion and compression stroke onto the pistons. A conventional ADPLL can follow these speed variations but phase differences between $f_{v[K]}$ and $f_{n[\hat{K}]}$, generally cannot be avoided.

Figure 15:
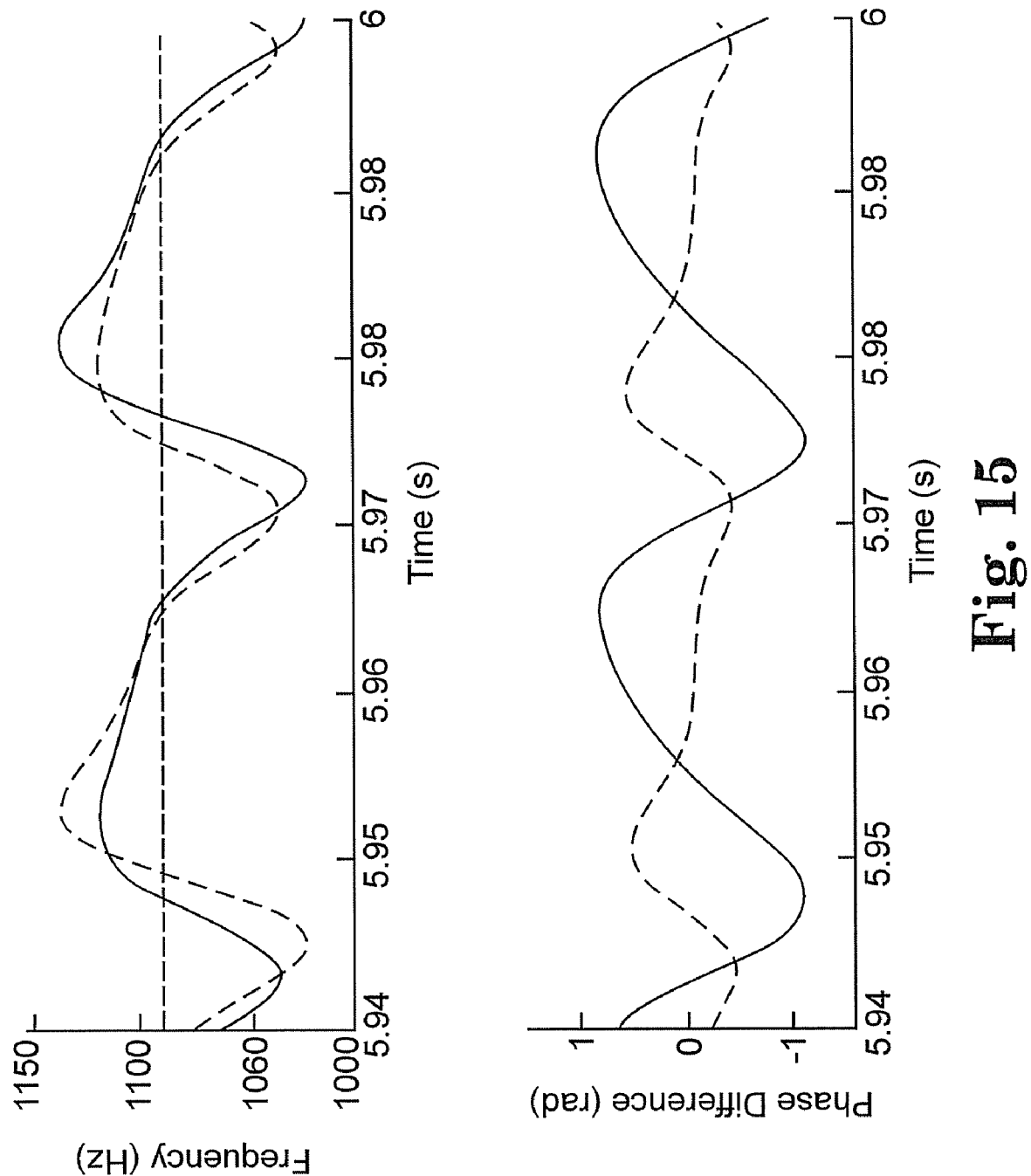
FIG. 15 illustrates simulation results for embodiments of two ADPLLs with different time constants.

Simulations in the frequency domain were carried out for conventional ADPLL with different time constants (TC). FIG. 15 shows the simulation results for two ADPLLs with different time constants, measured as rise time from 5% to 95% of the step response, of the DLF. (In FIG. 15, solid: varying input frequency; dash: TC=300 ms; dot: TC=2.2 ms). Using a large time constant for the DLF, the ADPLL generates a constant output frequency $f_{n[\hat{K}]}$. and a phase difference between $f_{v[K]}$ and $f_{n[\hat{K}]}$ of up to 1.12 rad appears. Decreasing the time constant allows reducing—but not eliminating—this phase difference.

Figure 16:
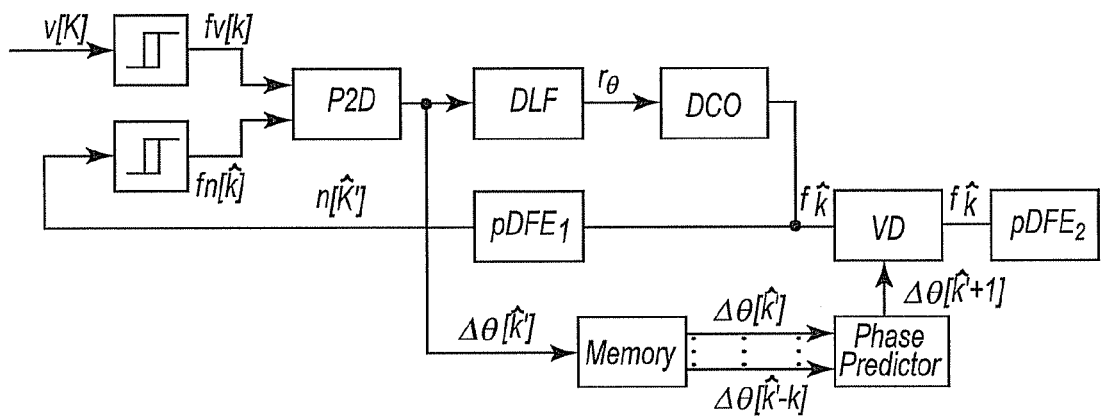
FIG. 16 is a block diagram illustrating an embodiment of a Predictive ADPLL (pADPLL).

FIG. 16 illustrates an embodiment of a Predictive ADPLL (pADPLL). The fast frequency variations at the input can also be expressed by a constant center frequency and varying phase shift. A conventional ADPLL with large (compared to the frequency variations) time constant, is used to generate the constant center $f_{\hat{K}'}$. The remaining phase difference between $f_{n[\hat{K}']}$ and $f_{v[K]}$ is measured using P2D and stored in memory. By evaluating the stored last values of the phase difference, the next value can be estimated by the phase predictor. The Variable Delay Line (VD) is used to introduce the estimated phase shift into the constant frequency $f_{\hat{K}'}$. Using this approach the frequency variations get reproduced by a constant center frequency with varying phase shift.

Figure 17:
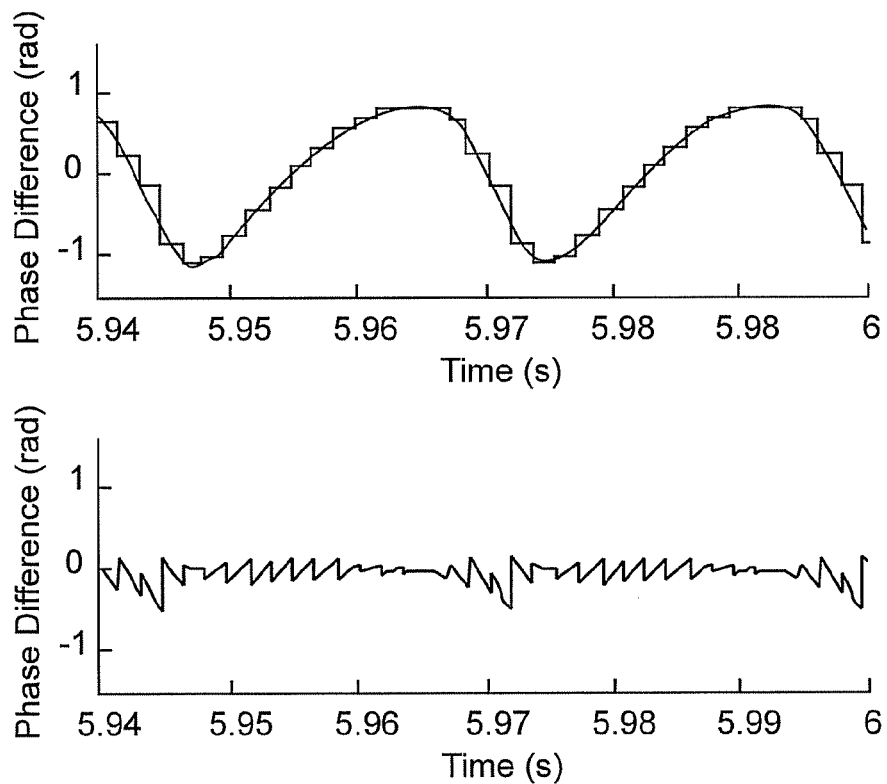
FIG. 17 illustrates simulation results of a pADPLL in the frequency domain.

FIG. 17 shows simulation results of a pADPLL in the frequency domain. Again the varying frequency shown in FIG. 15 was used as input. A DLF with a time constant of 300 ms is used to generate the constant center frequency $f_{\hat{K}'}$. The predictor has a sample period of 17 ms and uses second order polynomial interpolation of the last three memorized values of the phase difference to estimate the next value. Compared to a conventional ADPLL with fast DLF, the phase difference between $f_{v[K]}$ and $f_{\hat{K}}$ was reduced from 0.7 rad to 0.5 rad. This value can be improved by using a predictor with higher sampling rate or an enhanced prediction algorithm.

The presented structure in FIG. 16 uses two pDFE circuits. One (pDFE$_1$) is used to track the center frequency $f_{\hat{K}'}$. The other one (pDFE$_2$) is clocked by the phase shifted center frequency $f_{\hat{K}}$ which allows removing ISI and high accurate angle measurements.

The modeled sensor arrangement consists of a rotating pole wheel with the pattern m[K] as shown in FIG. 18 and two Hall elements on a separation distance of 1 MR. FE simulations were carried out to calculate the magnetic field at a distance of 2 mm and consequently the differential voltage v(x) of the two Hall elements.

The pDFE structure shown in FIG. 10 was modeled as follows: The adaptive algorithm uses Newton method to estimate the two physical values (gap and magnetic dipole moment). To improve the angular accuracy, 32 samples per magnetic region were used. The geometric length for both FBF was defined as 4.5 MR and therefore two filters with an order of 143 (144 filter taps) were used. An ADPLL with a system clock of 25.6 MHz and a frequency range between 32×800 and 32×8,000 Hz was used for clock recovery. However, this is only one of many possible implementations of the pDFE and the pADPLL structure.

FIG. 18A shows the signals of the modeled pDFE after the position is coarsely tracked using m̂(x,t). The parameter values are not yet estimated properly and therefore the calculated waveform n[K̂], using the simple model, does not match the waveform v(x) of the differential sensor output voltage. Discrepancies between the zero values of these two waveforms cause the phase error between the magnetic pattern m[k] on the wheel and the pDFE output m̂[k̂].

The estimated physical values by the AA converge to the physical parameters values of the channel and after 20 adapting steps the parameters are well estimated. With the well estimated physical parameter values the calculated waveform is matching the output voltage of the two sensor elements as shown in FIG. 18B. Therefore also the ISI of the channel can be removed and the pDFE output m̂[K̂] matches the pattern m[K] with high accuracy.

The simulations in the time domain have shown that ISI of a transmission channel can be removed. However, the main advantage of the pDFE is that the displacement of zero crossing point can be compensated and the angular accuracy becomes independent to the gap between sensor element and rotating wheel. Therefore, simulations with different physical gaps were carried out. FIG. 19 shows the simulation results for a gap of 4 mm after 20 adapting steps. Again, ISI effects of the channels get removed and a phase error of 0.07 MR remains. The phase error no longer depends on the gap and can be defined by design parameters like clock frequency and filter length.

Thus, known sensors can detect zero crossings with high accuracy but their concepts do not compensate the displacements of zero crossings (up to 28% of one magnetic region on the pole wheel) which are caused by gap variations. The disclosed sensor with dynamic displacement compensation calculates and compensates the displacements resulting from variations of physical parameters (gap, temperature, magnetic dipole moment, etc.). For calculation, a simple physical channel model is used and an adaptive algorithm estimates the parameter values. As further benefit, the estimated physical values can be made available as additional sensor outputs.

Figure 20:
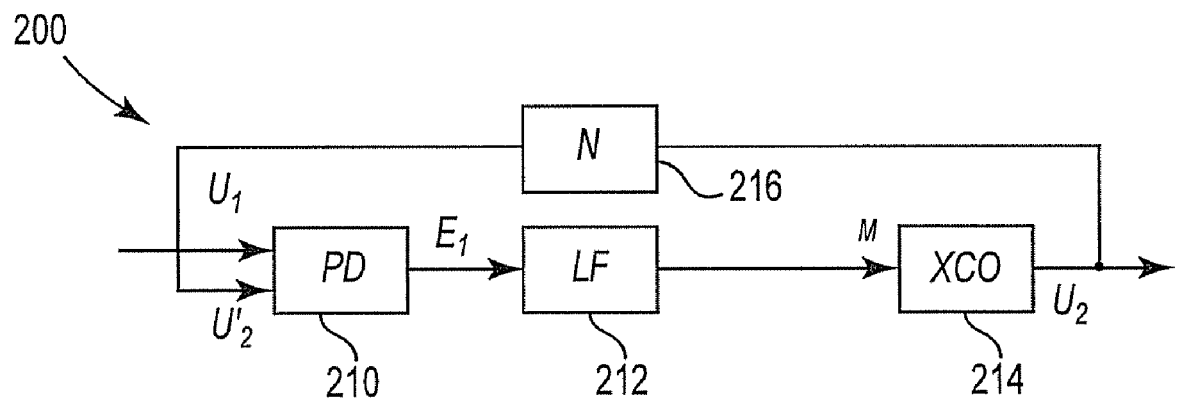
FIG. 20 is a block diagram illustrating an embodiment of a PLL.

As noted above, a PLL is employed in certain embodiments. The Phase Locked Loop (PLL) is a known circuit that is used, e.g., for clock pulse synchronization. FIG. 20 illustrates a block diagram of a typical PLL 200 with a Phase Detector (PD) 210, Loop Filter (LF) 212, Voltage Controlled Oscillator or Digital Controlled Oscillator (xCO) 214 and Frequency Divider (N) 216.

When a constant frequency is applied to input $u_1$ of the PLL, a signal is generated by the PLL at output u2, which signal is identical to the output both in frequency and in phase. If the Frequency Divider N is greater than 1, the output frequency will be a multiple of the input frequency.

Figure 21:
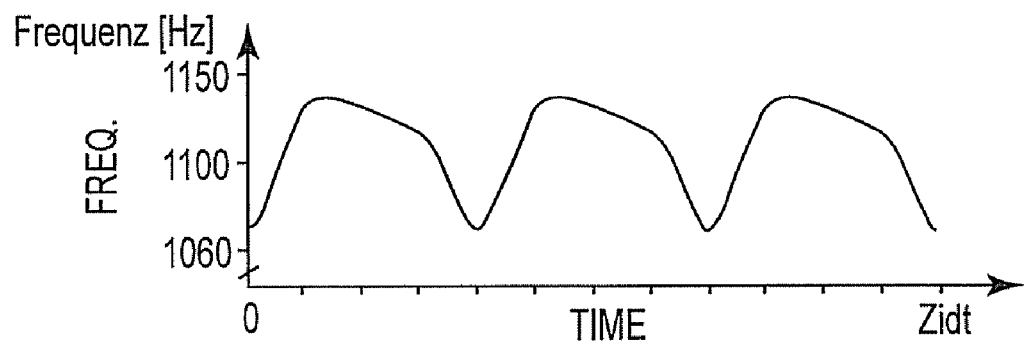
FIG. 21 illustrates an example of frequency changes at the input of a PLL.

However, the input frequency is not constant in every application. When the input frequency changes as a function of time, the PLL should follow these frequency changes and produce the same changes in frequency at the output. FIG. 21 illustrates an example of such frequency changes.

Conventional PLLs correct the changes in frequency at the input, and the output frequency changes as a result of the frequency change at the input. However, each control loop has a certain time constant and can follow changes at the input only with a certain delay. As a result, this necessarily leads to phase differences between the input and output signal.

For example, with digital signal processing of a sensor signal of camshaft/crankshaft sensors, the objective is to generate a clock signal that is in synchronization with the rotational speed of internal combustion engines (e.g., gasoline engines, diesel engines). The rotational speed of the internal combustion engines, however, is not constant. At the time of ignition, the camshafts/crankshafts can be seen to accelerate and at the time of compression, they can be seen to slow down (see curve in FIG. 21). Using conventional PLL circuits, this would lead to phase errors. Similarly, in data transmission, and even in synchronous data transmission, it can happen that the clock frequency of the transmitter has small frequency variations. The receiver must follow these frequency changes to the best of its ability. In most cases, this is done with a conventional PLL.

It is true that the use of a conventional PLL with a rapid control circuit (small time constant of the LF) can reduce these phase differences. However, phase differences can never be completely eliminated. In addition, the use of a small time constant also entails the drawback that high jitter occurs at the output frequency.

Figure 22A:
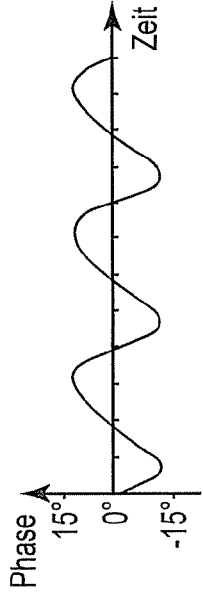
FIGS. 22A and 22B illustrate an example of phase shift at the input of a PLL as a function of time.
Figure 22B:
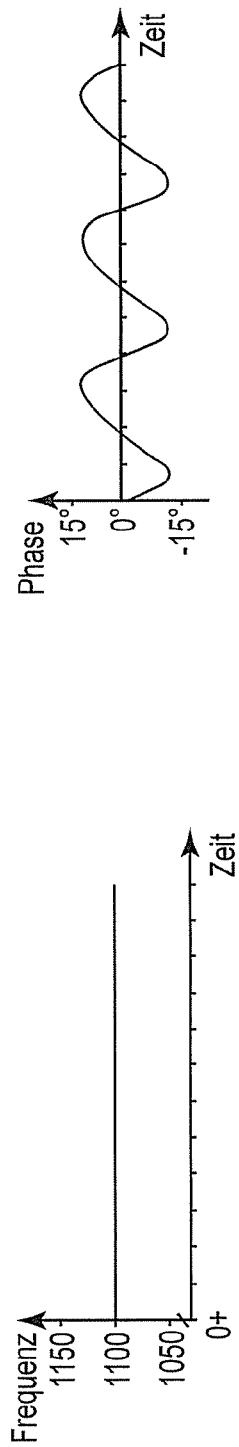

The changes in the frequency at the input (FIG. 21) can also be interpreted as a constant frequency (center frequency) with phase changes. FIGS. 22A and 22B illustrate phase shift at the input as a function of time, with the center frequency vs. time illustrated in FIG. 22A and phase vs. time in FIG. 22B.

Thus, using a conventional PLL, it is possible to produce the constant frequency and to generate the phase shift by means of a downstream circuit (a Variable Delay). The selected time constant of the PLL should be large enough to ensure that the output frequency changes only slowly.

The rapid phase changes are made possible by the Variable Delay Line. The phase shift is predicted by an estimation algorithm.

Figure 23:
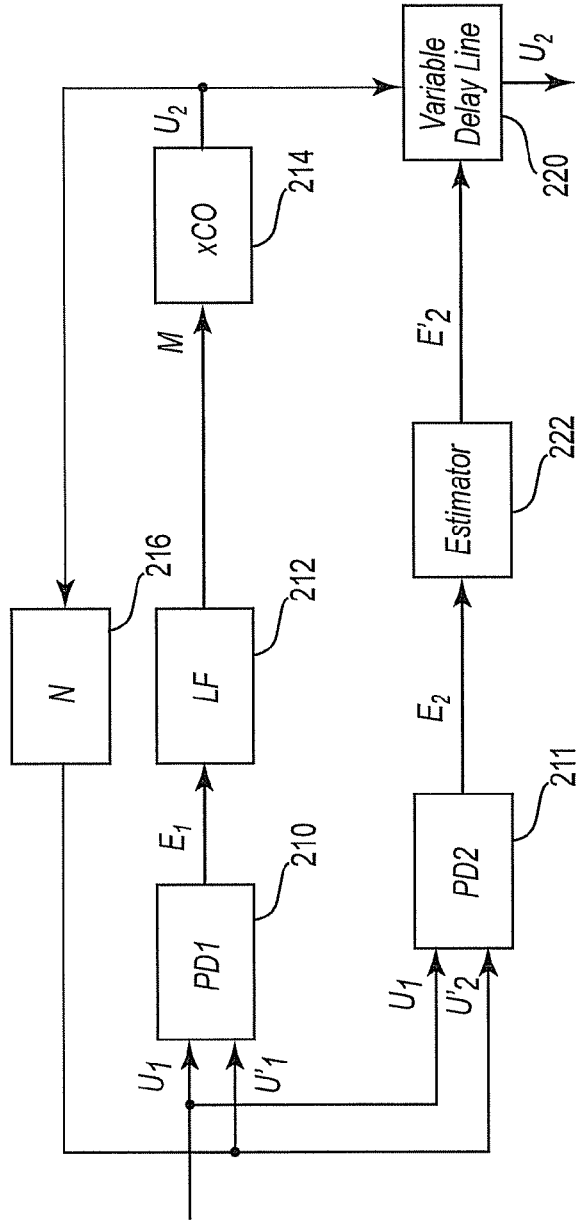
FIG. 23 is a block diagram illustrating an embodiment of a PLL with a variable delay line and a delay estimator.

FIG. 23 illustrates an embodiment of a PLL with a Variable Delay Line 220 and a delay estimator 222. Signal $u_2$ should correspond to the center frequency of the input signal. Therefore, the selected time constant of the PLL must be larger than the time constant of the phase changes at the input. The frequency of signal u2 thus corresponds to the product of input frequency $u_1$ and Frequency Divider N, i.e., $u_1 \cdot N$. Each function block illustrated in FIG. 23 can be implemented so as to be an analog, digital or mixed analog-digital. In alternative embodiments, Frequency Divider N is omitted.

The phase difference between signals $u_1$ and $u'_2$ is measured by Phase Detector PD2 211 and sent to the estimator 222. The estimator 222 stores one or several previous values of the measured phase differences $E_2$. Based on these previous values of the phase differences, the estimator 222 calculates the estimate for the present phase difference ($E'_2$). The estimate of the phase difference is sent to a Variable Delay Line 220, and the phase shift is generated. Output signal u3 is thus in phase with input signal $u_1$.

Since the frequency changes at the input (FIG. 21) in most cases have a periodic waveform, it is often possible to make a highly accurate prediction. It is useful to store one or more periods of the phase response and to use it/them for making the prediction.

Figure 24:
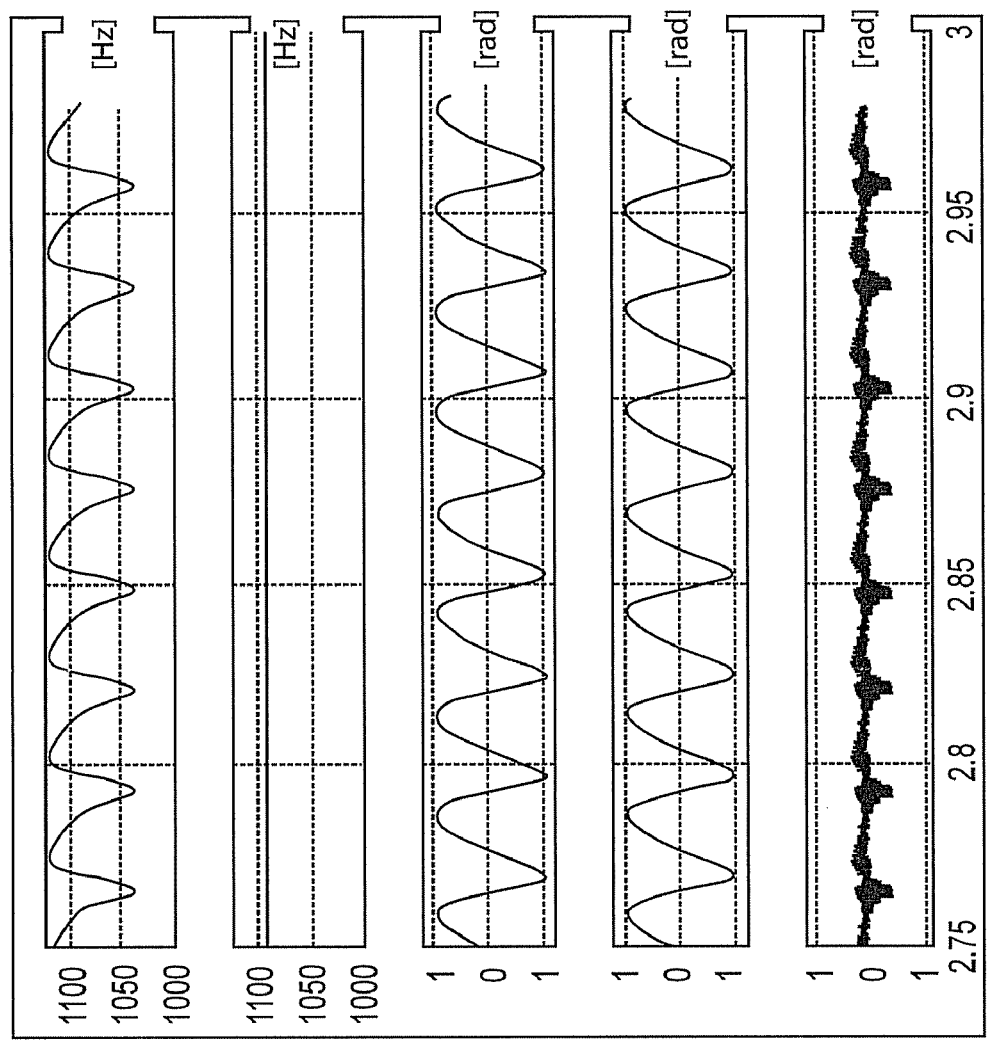
FIG. 24 illustrates simulation results for the PLL embodiment illustrated in FIG. 23 without the frequency divider.

FIG. 24 illustrates simulation results of the circuit of FIG. 23 without Frequency Divider 216 (or with N=1). The frequency u2 at the output of the PLL is the center frequency of input signal $u_1$. The phase error $E_1$ of the PLL is compensated for by the Delay Line 220. The predicted phase difference $E_2'$ estimated by the estimator 222 agrees with the measured phase difference $E_1$.

The phase difference between $u_1$ and $u_3$ is therefore smaller than the phase difference between $u_2$ and $u_3$. The residual error is attributable to the fact that the estimator 222 of the illustrated embodiment supplies an estimate only every 1.5 msec. The phase error could be further decreased by using a higher clock pulse frequency of the estimator (or interpolation).

Figure 25:
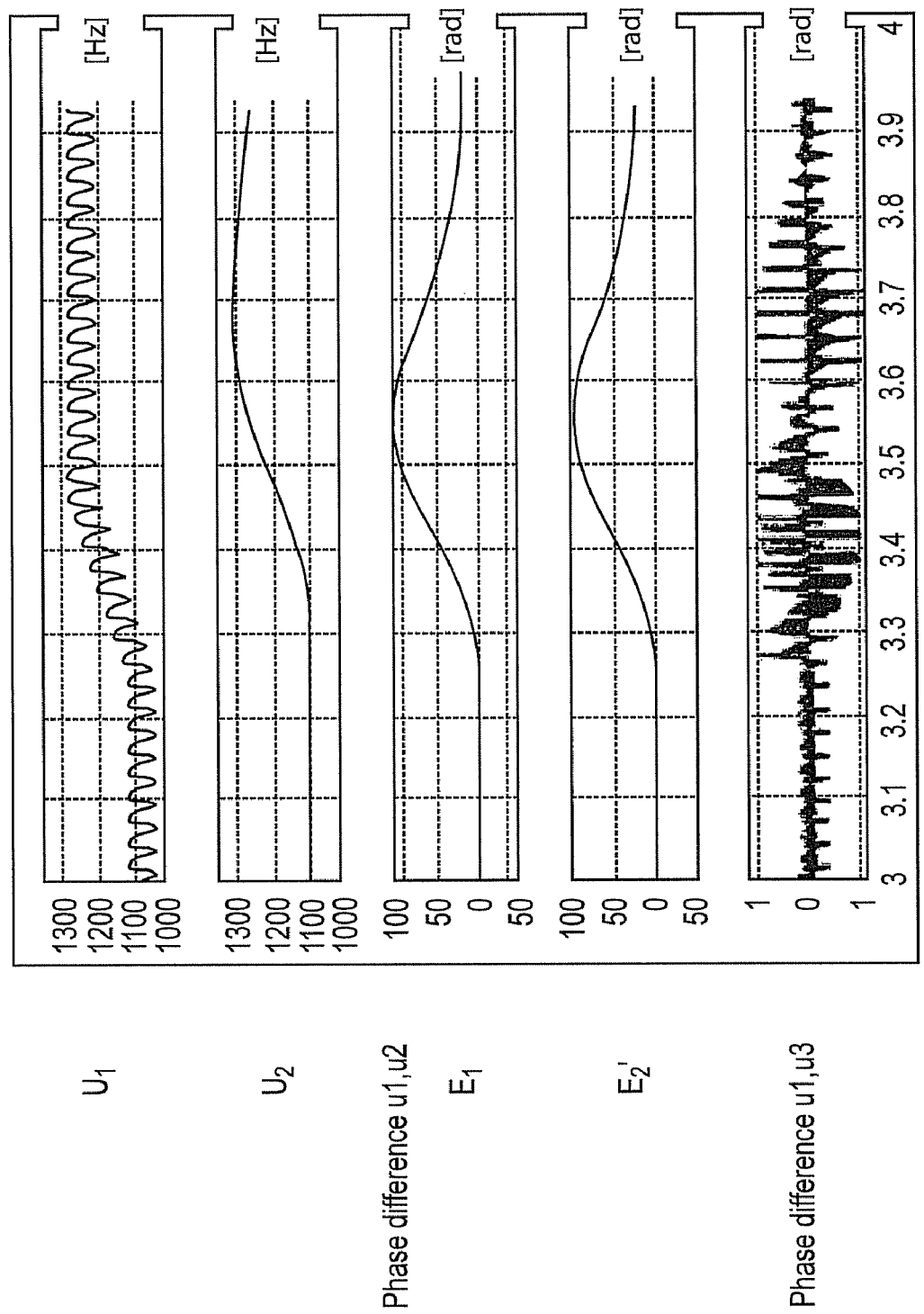
FIG. 25 illustrates simulation results for the PLL embodiment illustrated in FIG. 23 when the input signals are not periodic and when the center frequency changes at the input of the circuit.

FIG. 25 illustrates simulation results when the input signals are not periodic and when the center frequency changes at the input of the circuit. Due to the large time constant of the PLL, the frequency at the output of the PLL ($u_2$) follows the frequency changes with a delay, which leads to a large phase difference $E_1$. However, the estimator can predict this phase error rather accurately ($E_2'$) and compensate for it by means of the Delay Line.

Figure 26:
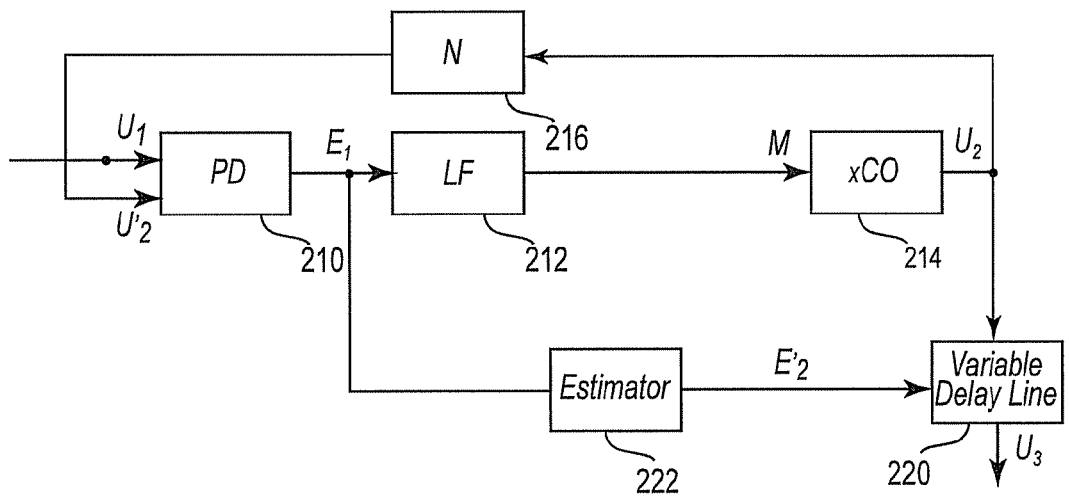
FIG. 26 is a block diagram illustrating an embodiment of a PLL with a single phase detector.

In some embodiments, the PD1 block 210 illustrated in FIG. 23 can be implemented as a Phase Detector, as a Phase Frequency Detector or as a Frequency Detector. PD2 can be implemented as a Phase Detector or as a Phase Frequency Detector. When PD1 and PD2 are identical, PD2 211 can be omitted. In this case, both the LF 212 and the estimator 222 use the phase difference E1 as the input signal, as shown for example, in FIG. 26.

In other embodiments, the Frequency Divider (N) 216 in FIG. 23 can be implemented using a constant or variable division factor. The division factor can be each integer or decimal number. As shown in FIG. 16 also the use of the pDFE structure as frequency divider is possible.

Figure 27:
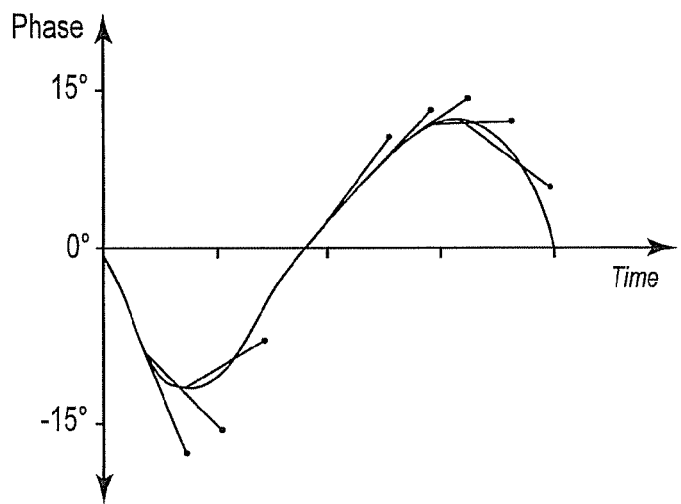
FIG. 27 illustrates an example of estimation of future value using a polynomial extrapolation.

To calculate the current phase shift E2', the estimator 222 can use one or more Previous phase differences $E_2$ (or $E_1$). To arrive at an estimate, many different variations can be used. Two practical examples will be described below:

Polynomial Extrapolation:

Using a polynomial extrapolation, the future value can be estimated based on the last values. FIG. 27 illustrates an example wherein the future value is estimated by means of linear extrapolation (polynomial of the first order) based on the last two values of $E_2$ (or $E_1$). In practice, it is useful to use more than two previous values for estimating the future value. It is also useful to use a polynomial of a higher order.

Cyclic Extrapolation:

Since the frequency changes in most cases have a periodic pattern (cycle), it is useful to use the phase differences of previous cycles for the calculation. The length of a cycle must be known by the estimator or it must be determined by the estimator.

Similar as in the polynomial extrapolation, the future value is estimated from the last values. The only difference is that the future value is estimated at the same position from values at a certain cycle position.

Figure 28:
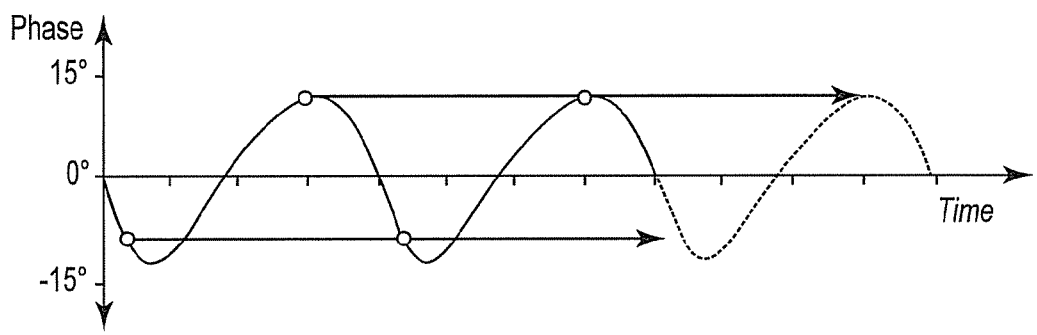
FIG. 28 illustrates an example of estimation of future cycle using a cyclical extrapolation.

FIG. 28 illustrates an example wherein two positions of the future cycle are estimated at two positions of the previous cycles by means of linear extrapolation. In practice, it is useful to use more than two previous cycles for estimating the future value. It is also useful to use a polynomial of higher order. The predicted value can be calculated not only by extrapolation but also by averaging the value of previous cycles, for example.

Figure 29:
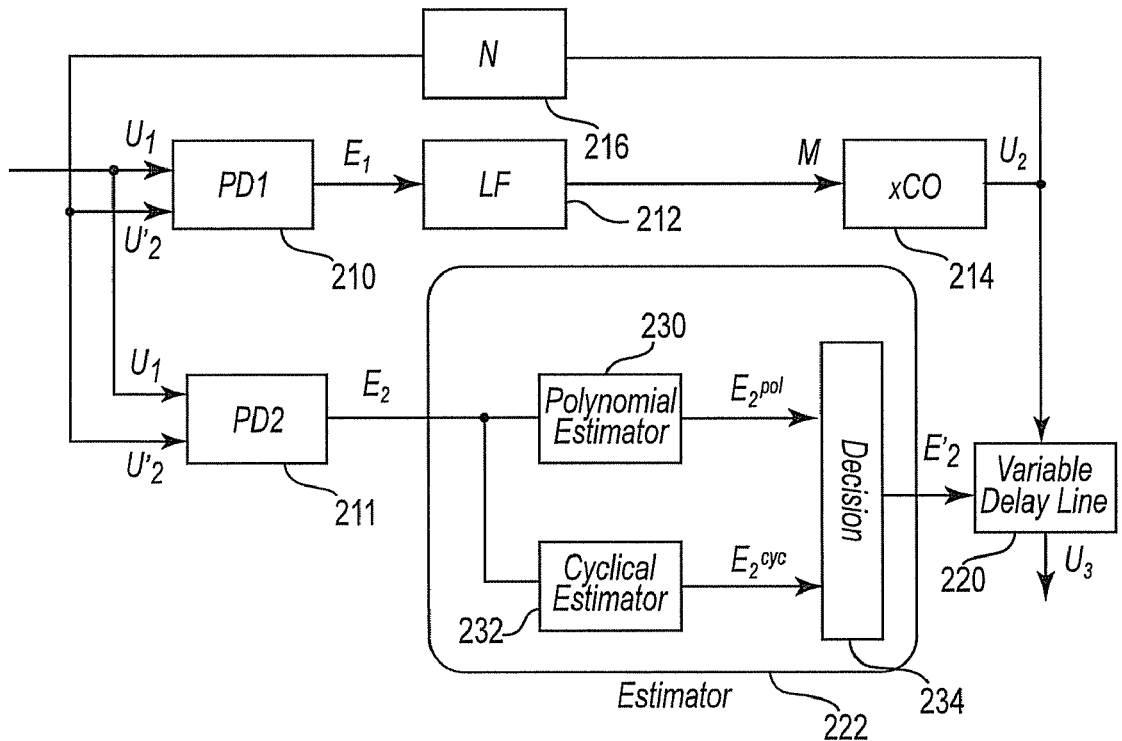
FIG. 29 is a block diagram illustrating an embodiment of a PLL with an estimator that uses both polynomial and cyclical extrapolation.

To arrive at an estimate, it is also possible to use two or more different estimation methods which independently of each other lead to estimates. The example in FIG. 29 shows a mixture of the polynomial 230 and cyclical 232 extrapolation: Both estimators calculate one estimate each for the future delay of the Delay Line 220 and send this value (E2polynomial and E2cyclical) to a decision-making component 234. Based on these estimates, the Decision-Making Component 234 subsequently calculates the estimate E2' for the Delay Line 220.

To calculate E2' from E2cyclical and E2polynomial, it is useful to determine the level of accuracy of the individual estimates. There are several methods by which the level of accuracy can be determined, including the following examples.

The level of accuracy is predefined (e.g., all estimators have the same level of accuracy or estimator A has a level of accuracy of 70% and estimator B has a level of accuracy of 30%, etc.).

Figure 30:
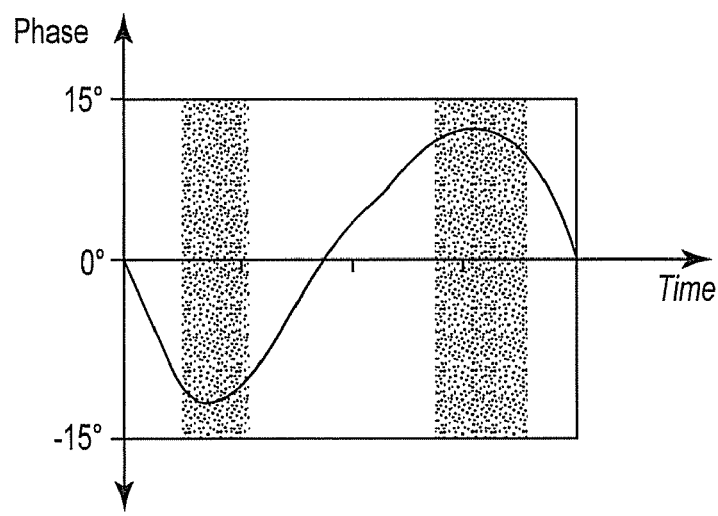
FIG. 30 illustrates an example where determination of the level of accuracy is based on a cycle waveform.

The accuracy criterion can be calculated as a function of the phase cycle. FIG. 30 illustrates one practical example where determination of the level of accuracy is based on the cycle waveform. In cases of a linear waveform of the cycle, the polynomial estimator is to be preferred, and in cases of extreme values, the cyclical estimator is to be preferred. There may also be a slow transition between the areas. The accuracy function can be preset or it can be adaptively determined.

Figure 31:
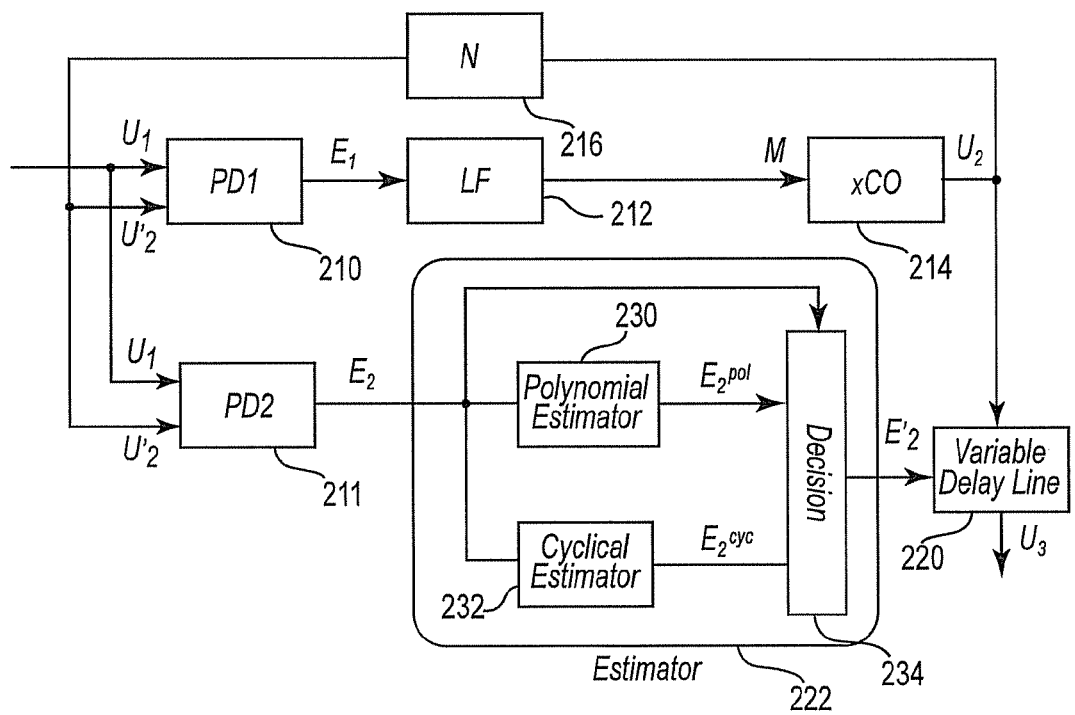
FIG. 31 is a block diagram illustrating an embodiment of a PLL with an estimator using multiple estimates with weighting.

The level of accuracy can be determined by comparing previous estimates (E2cyclical and polynomial) with the associated actually measured phase errors E2. FIG. 31 illustrates an embodiment using multiple estimates with weighting. This comparison makes it possible to calculate an error of each of the estimators. Thus, the level of accuracy of the estimators can be determined at each cycle position. The level of accuracy can also be determined adaptively.

There are several ways to calculate E2' from E2cyclical and E2polynomial while taking the level of accuracy into account. For example, the decision-making component 234 selects the estimate with the higher level of accuracy (i.e., E2' agrees either with E2cyclical or with E2polynominal). In other embodiments, E2' is calculated by means of a mathematical function. Such a function can be, e.g., averaging. If the level of accuracy of the estimators is taken into account, weighted averaging takes place. The weight function can also be determined adaptively.

The waveform of the frequency changes can be known and can be stored in a memory. The waveform of the frequency changes may be based on physical relationships. If this is the case, the estimator 222 can use a physical model for its calculation. If it is not possible to find a physical model, an analytical model or a mixed model (analytical-physical) can be used.

The values of the physical parameters can be determined by measurements and/or by adaptive algorithms. The values of the analytical parameters can be determined by adaptive algorithms. It is also possible to measure the center frequency of input signal u1 and to use it for the calculation.

Figure 32:
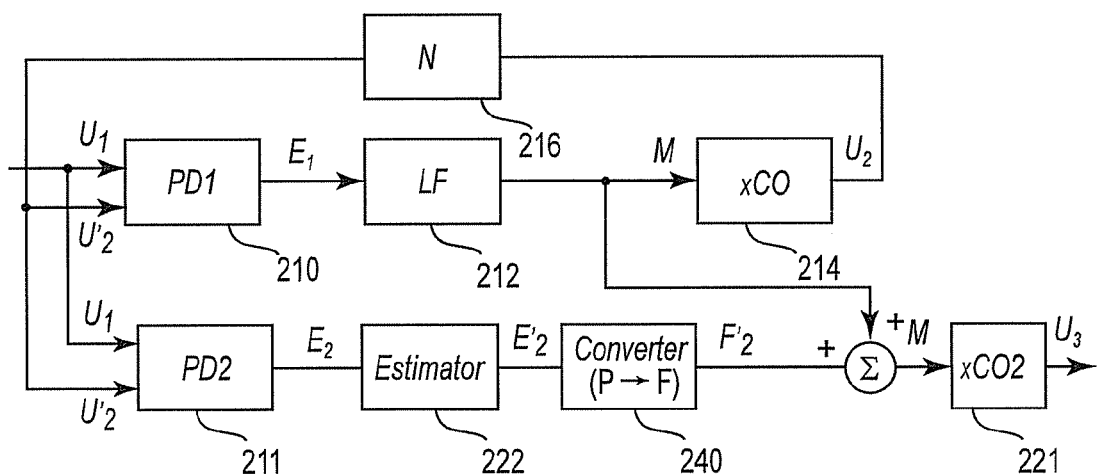
FIG. 32 is a block diagram illustrating an embodiment of a PLL with a frequency change converter and a second oscillator.

The desired phase shift E2' can also be converted into a frequency change converter (P→F) 240, and the Variable Delay Line can be replaced with a second xCO (xCO2) 221 as illustrated in FIG. 32.

Figure 33:
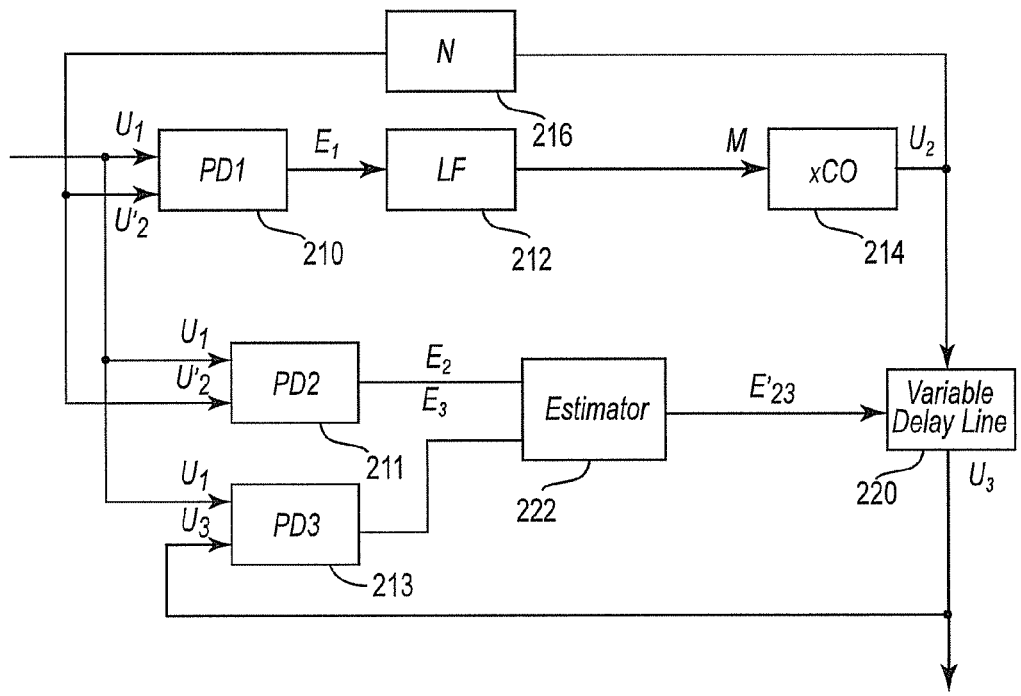
FIG. 33 is a block diagram illustrating an embodiment of a PLL with a third phase detector to measure delay of a delay line.
Figure 34:
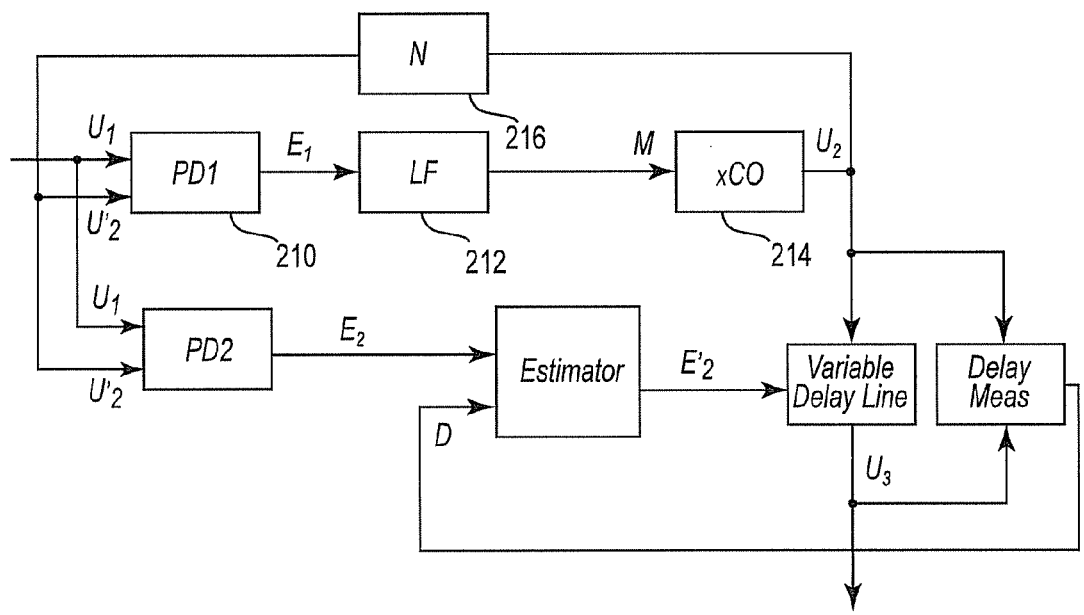
FIG. 34 is a block diagram illustrating an embodiment of a PLL using a direct measurement of delay of a delay line.

Another option is to measure the delay of the Delay Line 220. This detects changes of the Delay Line 220 (e.g., as a function of the temperature or aging), and these changes can be compensated for by the estimator 222. To calculate the compensation, for example, an adaptive algorithm can be used. The delay of the Delay Line 220 can be measured by a Phase Detector (PD3) 213 as illustrated in FIG. 33. PD3 213 can be implemented as a Phase Detector or as a Phase Frequency Detector. The delay can also be measured directly in the Delay Line 220, as in the embodiment illustrated in FIG. 34.

If the frequency variations at the input are periodic, the estimator is able to predict the phase difference with very high accuracy. The phase difference between input and output is thus nearly completely compensated for.

When a conventional PLL with the input signal as shown in FIG. 21 is used, the options of designing the PLL are limited. The LF can have either a small time constant (rapid PLL with a high jitter) or a large time constant (large phase differences between u1 and u2). The circuit illustrated above, on the other hand, makes possible low jitter and small phase differences between u1 and u3.

When an estimator with an adaptive algorithm is used, it is not only possible to generate the frequency but, in addition, it is also possible to adaptively determine additional information from the frequency variations.

Among other things, this disclosure has addressed a PLL circuit optimized for frequency variations, a phase locked loop circuit optimized for cyclic frequency variations, and a PLL circuit optimized for cyclic frequency variations occurring at the crankshaft of a combustion engine and comparable processes. The system allows following frequency variations (and/or predictable frequency variations) of the input and minimize frequency errors and jitter at the output. A PLL using a nth order linear predictor for fast tracking of frequency variations and a PLL using a cyclic predictor for fast tracking of frequency variations (and combinations thereof), as well as methods to select the appropriate predictor have also been disclosed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase locked loop (PLL) circuit, comprising
a first signal detector having a first input terminal configured to receive a varying first input signal, a second input terminal configured to receive a second input signal that corresponds to the center of the first signal, and an output terminal configured to provide an output signal corresponding to a phase difference between the first and second input signals;
a delay estimator having an input terminal configured to receive the output signal from the first signal detector, wherein the delay estimator is configured to use a prediction algorithm based on past values of the output signal from the first signal detector and the received output signal from the first signal detector to output a phase difference estimation signal;
a variable delay circuit having an input terminal configured to receive the phase difference estimation signal and an output terminal configured to provide an output signal representing the second input signal phase shifted based on the phase difference estimation signal.

2. The PLL circuit of claim 1, further comprising a second signal detector having a first input terminal configured to receive the first input signal, a second input terminal configured to receive the second input signal, and an output terminal configured to provide an output signal corresponding to a phase difference between the first and second input signals.

3. The PLL circuit of claim 2, further comprising a filter and an oscillator configured to receive the output signal from the second signal detector and in response thereto, output the second input signal.

4. The PLL circuit of claim 3, further comprising a frequency divider configured to receive the output signal from the oscillator and in response thereto, output the second input signal.

5. The PLL circuit of claim 1, wherein the delay estimator is configured to use a polynomial extrapolation based on past values of the output signal from the first signal detector to calculate the phase difference estimation signal.

6. The PLL circuit of claim 1, wherein the delay estimator is configured to use a cyclic extrapolation based on past values of the output signal from the first signal detector to calculate the phase difference estimation signal.

7. The PLL circuit of claim 1, wherein the variable delay circuit includes a controlled oscillator.

8. The PLL circuit of claim 1, wherein the delay estimator is configured to use:
a polynomial extrapolation based on past values of the output signal from the first signal detector to calculate a first phase difference estimation signal;
a cyclic extrapolation based on past values of the output signal from the first signal detector to calculate a second phase difference estimation signal; and wherein the delay estimator further comprises a decision circuit configured to select between the first and second phase difference estimation signals.

9. The PLL circuit of claim 1, wherein the delay estimator is configured to receive a feedback signal from the variable delay circuit to calculate the phase difference estimation signal.

10. The PLL circuit of claim 1, wherein the first signal detector is one of a phase detector, a frequency detector or a phase and frequency detector.

11. A method of matching the frequency of an output signal with the frequency of an input signal, comprising
receiving a first input signal that has a varying input frequency;
receiving a second input signal that corresponds to the center of the input frequency
measuring a phase difference between the first and second input signals;
estimating a phase difference based on the measured phase difference between the first and second input signals and on past values of the phase difference between the first and second input signals, including at least one of a polynomial extrapolation based on past values of the measured phase difference, and a cyclic extrapolation based on past values of the measured phase difference;
phase shifting the second input signal in response to the estimated phase difference to provide an output signal.

12. The method of claim 11, wherein estimating the phase difference includes selecting between the results of the polynomial extrapolation and the cyclic extrapolation.

13. The method of claim 12, wherein selecting the results includes assigning a predetermined level of accuracy to the polynomial extrapolation and the cyclic extrapolation.

14. The method of claim 12, wherein selecting the results includes assigning an adaptive level of accuracy to the polynomial extrapolation and the cyclic extrapolation.

15. The method of claim 12, wherein selecting the results includes comparing previous estimates of phase difference with corresponding measured phase differences.

* * * * *